United States Patent
Kosaka et al.

(10) Patent No.: US 7,541,818 B2
(45) Date of Patent: Jun. 2, 2009

(54) METHOD AND APPARATUS OF ELECTROMAGNETIC MEASUREMENT

(75) Inventors: Hirofumi Kosaka, Ishikawa (JP); Kazuhiko Ikeda, Ishikawa (JP); Shoichi Kajiwara, Osaka (JP); Hiroyuki Tani, Osaka (JP); Yoichiro Ueda, Osaka (JP); Atsushi Yamamoto, Kyoto (JP)

(73) Assignee: Panasonic Corporation, Osaka (JP)

( * ) Notice: Subject to any disclaimer, the term of this patent is extended or adjusted under 35 U.S.C. 154(b) by 290 days.

(21) Appl. No.: 11/482,063

(22) Filed: Jul. 7, 2006

(65) Prior Publication Data
US 2007/0024293 A1 Feb. 1, 2007

(30) Foreign Application Priority Data
Jul. 7, 2005 (JP) ............................. 2005-198441
Dec. 13, 2005 (JP) ............................. 2005-358366

(51) Int. Cl.
*G01R 31/302* (2006.01)
(52) U.S. Cl. .................................................... 324/750
(58) Field of Classification Search ................. 324/258, 324/765, 750, 158.1, 260, 117 R, 117 H, 324/127; 257/48; 439/14–18
See application file for complete search history.

(56) References Cited

U.S. PATENT DOCUMENTS 6,456,070 B1 * 9/2002 Kazama et al. ............. 324/260
6,696,834 B2 * 2/2004 Kou et al. .................. 324/258

* cited by examiner

*Primary Examiner*—Ha Tran T Nguyen
*Assistant Examiner*—Tung X Nguyen
(74) *Attorney, Agent, or Firm*—Steptoe & Johnson LLP

(57) ABSTRACT

In order to direct a probe having directivity that a received band is widened in accordance with a measurement distance, toward a DUT, shift the received band of the probe in sequence, receive electromagnetic, and measure electromagnetic interference, a plurality of long and short measurement distances between the probe and the DUT are set, and measurement at the long measurement distance and measurement at the short measurement distance are performed plural times. Herein, the measurement at the short measurement distance is performed on a received band where electromagnetic interference is measured by the measurement at the long measurement distance. Thus, measurement of electromagnetic interference can be performed with high accuracy in a short time.

7 Claims, 17 Drawing Sheets

METHOD AND APPARATUS OF ELECTROMAGNETIC MEASUREMENT

BACKGROUND OF THE INVENTION

1. Field of the Invention

The present invention relates to a method and an apparatus of electromagnetic measurement. More specifically, the present invention relates to a method and an apparatus of electromagnetic measurement, for measuring electromagnetic waves emitted from an electronic device, constituent elements thereof and peripheral devices thereof, mainly, electromagnetic interference in an electromagnetic near field.

2. Description of the Related Art

In order to prevent that unnecessary radiation from an electronic device interferes with another device and exerts harmful influences on a human body, recently, regulations are established in many countries. At overseas, for example, there are established standards by FCC (Federal Communications Commission), CISPR (Comittie International Special des Perturbations Radioelectrique), VDE (Verband Deutscher Elektrotechniker) and the like. Also in Japan, there is established voluntary restraint standards by VCCI (Voluntary Control Council for Interference by Information Technology).

In general, regulations for unnecessary radiation, that is, electromagnetic interference are established for respective frequencies in a wide range of 30 MHz to 1 GHz. This range includes an electromagnetic field at an extremely low frequency of 50 Hz to 60 Hz on a power transmission line, and radio waves from a very low frequency in an electromagnetic cooker to a very high frequency in a TV set, a microwave oven and a portable telephone.

Electromagnetic is a wave that an electric field and a magnetic field vibrate in a pair to transmit electromagnetic energy to a space. Measurement for electromagnetic interference is performed as follows: an electric field intensity or a magnetic field intensity is measured at a position spaced away from an electronic device, serving as a source of electromagnetic, by a predetermined distance. In order to block extraneous noise, a special environment and a special apparatus are used for this measurement. Consequently, the measurement requires expert knowledge, and takes much time.

In order to solve the aforementioned disadvantages, an electromagnetic measurement apparatus for measuring an intensity of near electromagnetic emitted from various circuits such as a printed circuit board in an electronic device is used for reducing time and cost for measurement. For example, there is known that such an apparatus uses an electric field sensor or a magnetic field sensor to measure an electric field intensity or a magnetic field intensity near an electronic device, prepares a frequency spectrum based on a maximum value of the measured magnetic field intensity and prepares electromagnetic field intensity distribution at a high frequency based on the frequency spectrum of the maximum value to thereby search for an emission noise source, analyze an emission noise generation mechanism and confirm a countermeasure effect (see, e.g., JP2002-372558A). There is also known the following technique: an antenna array including a plurality of antennas is used for receiving electromagnetic emitted from a device under test by one of the antennas arranged at a distance from the device under test, and detecting an electromagnetic emission pattern from the device under test based on the received information to thereby reduce time for measurement (see, e.g., JP2004-77336A).

In any of the aforementioned techniques, in order to identify a cause and a site of electromagnetic interference from an electronic device, it is necessary to scan a whole range of an electromagnetic near field in the device under test by use of one or a limited number of receivers with directivity. As disclosed in JP2002-372558A and JP2004-77336A, the receiver scans a position at a predetermined distance from the electromagnetic near field in the device under test.

There is also known a method of obtaining distribution of currents passing through a device under test from distribution of magnetic fields measured by a magnetic field sensor at a position spaced away from the device under test by an optional distance, and obtaining an electric field intensity at the optional distance based on the current distribution (see, e.g., JP2003-279611A).

There is also known the following technique. In a case of measuring a device under test having surface irregularities, a distance sensor for measuring a distance between an electromagnetic field sensor and the device under test is used together with the electromagnetic field sensor. An electromagnetic field intensity measured by the electromagnetic field sensor is subjected to distance correction in accordance with a distance between the device under test and the electromagnetic field sensor (see, e.g., JP2000-230954A).

Next, description will be given of measurement of electromagnetic interference with reference to FIGS. 9A to 9C. Herein, an antenna "b" disclosed in JP2004-77336A has a received band in a device under test "a" widened in accordance with a measurement distance. For example, FIG. 9A illustrates a received band AN in a case of a measurement distance DS between the antenna "b" and the device under test "a", and FIG. 9B illustrates a received band AW in a case of a measurement distance DL longer than the measurement distance DS.

An electromagnetic intensity is inversely proportional to a square root of a distance. Therefore, as illustrated in FIG. 9A, if the measurement distance DS is short, the antenna "b" readily receives electromagnetic and a measurement resolution can be enhanced. However, a received band becomes narrow as shown by the received band AN. If the received band becomes narrow, a number N of received bands in a whole range of a measurement region is increased by n (n=48 in a schematic diagram of FIG. 9C), so that it takes much time t to perform measurement, that is, t=Tn. When the received band is widened by the measurement distance DL within a range of an electromagnetic near field as illustrated in FIG. 9B, the received band is widened as shown by the received band AW, so that the number N of received bands is decreased by m. As a result, the measurement time t is reduced without effort, that is, t=Tm. However, since an electromagnetic intensity to be received is lowered and a resolution for measurement is also lowered, measurement with high accuracy cannot be performed.

At present that measurement with high accuracy is indispensable in order to offer a product without a problem about electromagnetic interference, if electromagnetic interference is measured upon designing and manufacturing a product, a whole electromagnetic emission region of the device under test "a", including a region having no electromagnetic interference, must be scanned with a high resolution in such a manner that a measurement distance is set at the measurement distance DS and a received band is set at the received band AN. This results in prolonged time for measurement and increased cost for a product.

Moreover, an electromagnetic measurement apparatus does not receive radiation from a device under test, but receives extraneous noise from a farfield. In order to avoid such a situation, it is necessary to place the device under test and the electromagnetic measurement apparatus in a large-size shield room or a large-size anechoic room. This results in increased cost for measurement, that is, increased cost for a product.

It is an object of the present invention to provide a method and an apparatus of electromagnetic measurement, that can perform measurement with high accuracy in a short time and can be realized in a compact facility.

If a conventional electromagnetic measurement apparatus estimates a current source which is a source of unnecessary radiation from a device under test, the following problem arises. In a method of estimating a current source from a single electromagnetic field, a degree of accuracy for estimating a current at each measurement point on the device under test varies due to variety such as a mechanism, a structure and a material of each measurement point. Consequently, uniform evaluation cannot be performed in an area to be measured.

Further, if an electromagnetic field sensor moves within a plane spaced away from a device under test having surface irregularities by a predetermined distance in measurement of electromagnetic field distributions in electromagnetic containing unnecessary radiation from the device under test, distances between the device under test and the electromagnetic field sensor are different from each other at the respective measurement points. Therefore, even when electromagnetic field intensities are equal to each other in the measurement plane, if the distances between the device under test and the electromagnetic field sensor are different from each other, actual electromagnetic field intensities by electromagnetic emitted from the device under test are different from each other.

In order to solve the aforementioned disadvantage, there are a method of allowing an electromagnetic field sensor to move along irregularities on a surface of a device under test to perform measurement, and a method of measuring a distance between an electromagnetic sensor and a measurement point by a distance sensor, and subjecting an intensity of an electromagnetic field by electromagnetic emitted toward the measurement point to distance correction. However, these methods require much time. Further, since this measurement does not respond to a mechanism, a structure and a material of a device under test, a current cannot be measured correctly. Consequently, it is difficult to ensure accuracy of measurement.

Therefore, it takes much time to accurately detect unnecessary radiation from a device under test having a complicated surface structure. Hence, there arises a problem that it takes much time and cost to correctly grasp a failure of a device under test, which is a cause of unnecessary radiation.

It is another object of the present invention to provide a method and an apparatus of electromagnetic measurement, that can accurately detect unnecessary radiation from a device under test having a complicated surface structure in a short time, and can correctly grasp a failure of a device under test, which is a cause of unnecessary radiation, at a low cost.

SUMMARY OF THE INVENTION

A method of electromagnetic measurement according to the present invention, that can perform measurement with high accuracy in a short time and can be realized with a compact facility, has the following main features. That is, a method of electromagnetic measurement comprises: directing an electromagnetic field sensor having directivity that a received band is widened in accordance with a measurement distance toward a device under test; and receiving electromagnetic while shifting the received band in sequence to thereby measure electromagnetic interference. Herein, a plurality of long and short measurement distances between the device under test and the electromagnetic field sensor are set, measurement at the long measurement distance is performed plural times, and measurement at the short measurement distance is performed on a received band where electromagnetic interference is measured by the measurement at the long measurement distance.

With this configuration, in the measurement at the long measurement distance from among the long and short distances set for the electromagnetic field sensor within a range of the electromagnetic near field, the whole range of the electromagnetic emission region of the device under test is measured with reduced number of shifts of the received band having a large area, so that the received band where electromagnetic interference is measured can be identified. The received band thus identified is measured at the short measurement distance with a high resolution. Since an area to be measured is limited, the measurement can be completed in a short time although the received band area is small. Thus, electromagnetic interference and a generation site thereof can be measured with high accuracy at a high speed. As the number of repetition of measurements by the aforementioned relation at the different measurement distances is increased, measurement accuracy can be improved.

An apparatus of electromagnetic measurement according to the present invention, that can perform measurement with high accuracy in a short time and can be realized with a compact facility, has the following main features. That is, an apparatus of electromagnetic measurement comprises: an electromagnetic field sensor having directivity that a received band is widened in accordance with a measurement distance, and receiving electromagnetic; a scanning part allowing the electromagnetic field sensor and a device under test to relatively shift for each received band of the electromagnetic field sensor; a measurement distance changing part switching between a plurality of measurement distances between the electromagnetic field sensor and the device under test; a reception processing part processing electromagnetic information transmitted from the electromagnetic field sensor; and a controlling part performing measurement at a long measurement distance plural times, and performing measurement at a short measurement distance on a received band where electromagnetic interference is measured by the measurement at the long measurement distance.

If the electromagnetic interference measured by the measurement at the long measurement distance is not increased by the measurement at the short measurement distance, then the electromagnetic interference is determined as extraneous noise.

In this configuration, electromagnetic interference from the device under test is increased as the measurement distance becomes short. If the electromagnetic interference is not increased, then such electromagnetic interference can be determined as extraneous noise from a far field that is free from influence of difference in measurement distance.

The electromagnetic interference to be measured is at least one of a frequency and an intensity in an electromagnetic near field. In this configuration, the electromagnetic interference can be measured and evaluated for each frequency, each intensity, and both frequency and intensity.

The apparatus of electromagnetic measurement further comprises a switching part including an amplifier for amplifying electromagnetic information transmitted from the electromagnetic field sensor to output the amplified information to the reception processing part, and switching between a through path for directly outputting the electromagnetic information from the electromagnetic field sensor to the reception processing part and an amplifier path for outputting the electromagnetic information from the electromagnetic field sensor to the reception processing part via the amplifier.

In this configuration, if the electromagnetic field sensor has a low reception level of electromagnetic interference and the reception level is out of a reception dynamic range of the measuring part, the electromagnetic interference is received through the amplifier path via the amplifier so that the reception level is within the reception dynamic range; thus, measurement can be performed.

The switching part selects the through path to disconnect both input and output ends of the amplifier from electrical input. In this configuration, when the switching part selects the through path to disconnect both input and output ends of the amplifier from electrical input, there are no generated an electric field and a magnetic field by flow of currents and electromagnetic caused by these fields, and also, there is no generated an electric field by application of voltage.

A method of electromagnetic measurement according to the present invention that can accurately detect, in a short time, electromagnetic interference from a device under test having a complicated surface structure and can correctly grasp, at a low cost, a defective site of the device under test which serves as a cause of the electromagnetic interference, has the following features. That is, a method of electromagnetic measurement comprises: allowing an electromagnetic field sensor to move in a measurement plane spaced away from a reference plane of a device under test having an uneven surface structure to thereby measure an electromagnetic field intensity, and selecting a current estimation equation, corresponding to design data indicating the surface structure of the device under test, for each coordinate point in the measurement plane; and using the measured electromagnetic field intensity to estimate a current intensity for each coordinate point in the measurement plane based on the current estimation equation.

A method of electromagnetic measurement according to the present invention also has the following features. That is, a method of electromagnetic measurement comprises: allowing an electromagnetic sensor to move in a measurement plane spaced away from a reference plane of a device under test having an uneven surface structure to thereby measure an electromagnetic field intensity, and calculating a distance between a measurement point in the device under test and the electromagnetic sensor for each coordinate point in the measurement plane from design data indicating the surface structure of the device under test; and correcting and evaluating the measured electromagnetic field intensity based on the calculated distance.

A method of electromagnetic measurement according to the present invention also has the following features. That is, a method of electromagnetic measurement comprises: allowing an electromagnetic field sensor to move in a measurement plane spaced away from a reference plane of a device under test having an uneven surface structure to thereby measure an electromagnetic field intensity, and selecting a current estimation equation, corresponding to design data indicating the surface structure of the device under test, for each coordinate point in the measurement plane; calculating a distance between the measurement point in the device under test and the electromagnetic field sensor for each coordinate point in the measurement plane from the design data; and estimating a current intensity in the measurement plane for each coordinate point based on the measured electromagnetic field intensity, the selected current estimation equation and the calculated distance to evaluate the electromagnetic field intensity based on the estimated current intensity.

An apparatus of electromagnetic measurement according to the present invention that can accurately detect, in a short time, electromagnetic interference from a device under test having a complicated surface structure and can correctly grasp, at a low cost, a defective site of the device under test which serves as a cause of the electromagnetic interference, has he following features. That is, an apparatus of electromagnetic measurement comprises: an electromagnetic field sensor receiving an electromagnetic field from a device under test; a scanning part allowing the electromagnetic field sensor to move in a measurement plane spaced away from a reference plane of the device under test; a reception processing part performing measurement processing on the electromagnetic field intensity received by the electromagnetic field sensor moved by the scanning part; and a calculation processing part selecting a current estimation equation, corresponding to design data indicating a surface structure of the device under test, for each coordinate point in the measurement plane, and using the measured electromagnetic field intensity to thereby estimate a current intensity for each coordinate point in the measurement plane based on the current estimation equation.

An apparatus of electromagnetic measurement according to the present invention also has the following features. That is, an apparatus of electromagnetic measurement comprises: an electromagnetic field sensor receiving an electromagnetic field from a device under test; a scanning part allowing the electromagnetic field sensor to move in a measurement plane spaced away from a reference plane of the device under test; a reception processing part performing measurement processing on the electromagnetic field intensity received by the electromagnetic field sensor moved by the scanning part; and a calculation processing part calculating a distance between a measurement point in the measurement plane and the electromagnetic field sensor for each coordinate point in the measurement plane from design data indicating a surface structure of the device under test, and correcting the measured electromagnetic field intensity to an electromagnetic field intensity at a point spaced away from a measurement point in the device under test based on the calculated distance, for each coordinate point in the measurement plane.

An apparatus of electromagnetic measurement according to the present invention also has the following features. That is, an apparatus of electromagnetic measurement comprises: an electromagnetic field sensor receiving an electromagnetic field from a device under test; a scanning part allowing the electromagnetic field sensor to move in a measurement plane spaced away from a reference plane of the device under test; a reception processing part performing measurement processing on the electromagnetic field intensity received by the electromagnetic field sensor moved by the scanning part; and a calculation processing part selecting a current estimation equation, corresponding to design data indicating a surface structure of the device under test, for each coordinate point in the measurement plane, calculating a distance between a measurement point in the device under test and the electromagnetic field sensor for each coordinate point in the measurement plane from the design data, estimating a current intensity for each coordinate point in the measurement plane based on the measured electromagnetic field intensity, the selected current estimation equation and the calculated distance, and evaluating the electromagnetic field intensity based on the estimated current intensity.

The other and further objects and features of the present invention will be apparent from the following detailed description and drawings. Each of the features of the present invention can be adopted solely or by various combinations thereof.

With the method and the apparatus of electromagnetic measurement according to the present invention, measurements with difference in resolution at a plurality of measurement distances between an electromagnetic field sensor and a device under test are appropriately utilized to reduce the number of scans for measurement without lowering measurement accuracy and to improve a measurement speed. Thus, measurement with high accuracy can be performed in a short time. In addition, a product with high safety for peripheral devices and human bodies can be offered at a low cost.

It is determined, from a change in electromagnetic interference measured at a plurality of measurement distances in an electromagnetic near field, whether or not the electromagnetic interference is extraneous noise from a far field. Thus, measurement accuracy can be enhanced. In addition, since no large-size shield room or anechoic room is required, a product can be offered at a low cost.

Electromagnetic interference can be measured and evaluated for each frequency, each intensity, and both frequency and intensity.

If an electromagnetic field sensor has a low reception level of electromagnetic interference and the reception level is out of a reception dynamic range of a measuring part, an amplifier is used so that the reception level is within the reception dynamic range. Thus, measurement can be performed.

When a switching part selects a through path, there are no generated an electric field and a magnetic field by flow of currents in an amplifier and electromagnetic caused by these fields, and also, there is no generated an electric field by application of voltage. Thus, measurement can be smoothly performed.

When electromagnetic emission from a device under test is measured while an electromagnetic field sensor moves in a measurement plane near the device under test, specification data of the device under test serving as a decision factor of an electromagnetic field intensity or structure information of the device under test for calculating a distance between a measurement point in the device under test and the electromagnetic field sensor is utilized as design data of the device under test. Thus, with respect to a device under test having a complicated surface structure, a current intensity or an electromagnetic intensity in consideration of structural difference of the device under test can be readily measured with high accuracy for each coordinate point in the measurement plane.

Therefore, electromagnetic interference from a device under test having a complicated surface structure can be accurately detected in a short time. Further, a defective site of the device under test, serving as a cause of electromagnetic interference, can be correctly grasped at a low cost.

In addition, since design data of a device under test is used, a sensing function other than an electromagnetic field sensor becomes unnecessary; thus, an apparatus of electromagnetic measurement can be realized at a low cost.

DESCRIPTION OF THE PREFERRED EMBODIMENTS

Hereinafter, in order to understand the present invention, description will be given of an electromagnetic measurement method and an electromagnetic measurement apparatus according each embodiment of the present invention with reference to the drawings. The following description is merely a specific example of the present invention; therefore, the scope of claims for patent is not limited thereto.

First Embodiment

Figure 1:
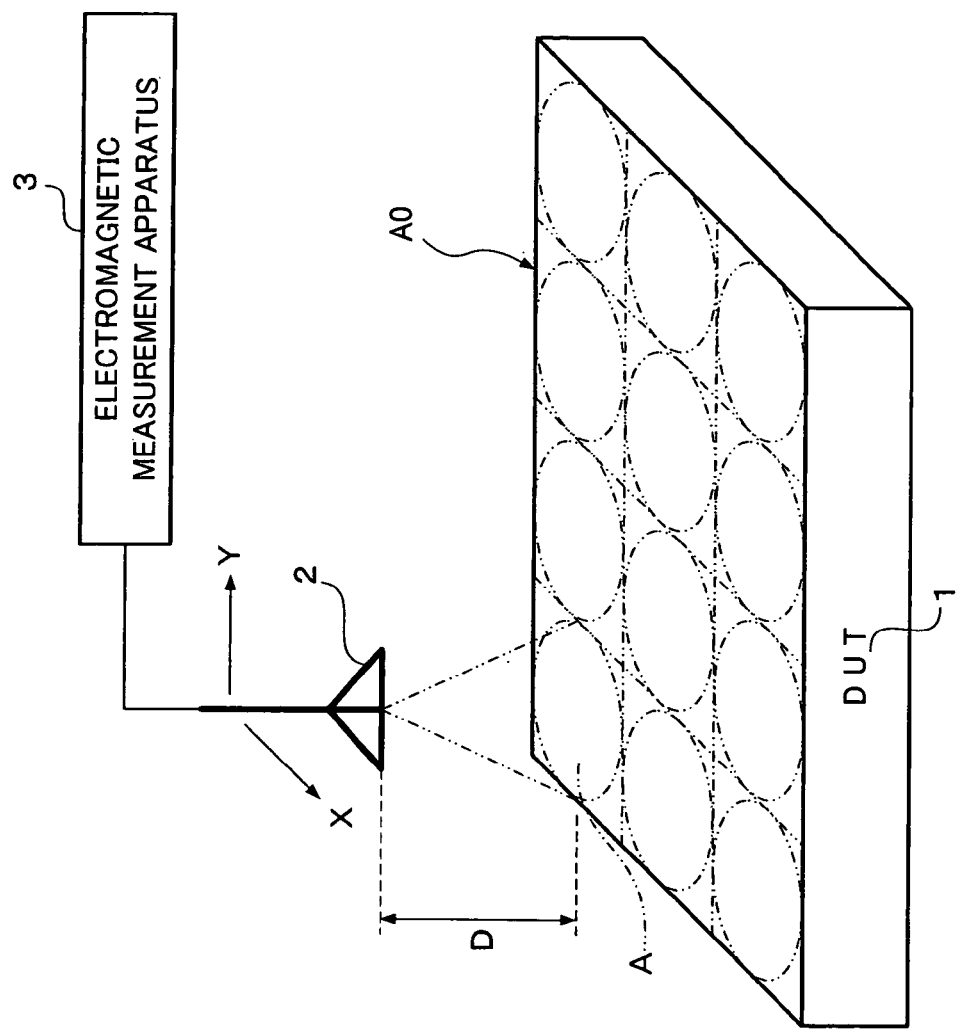
FIG. 1 is a perspective view illustrating an example of a measurement state by a wide-range scan adopted by an electromagnetic measurement method and an electromagnetic measurement apparatus according to a first embodiment of the present invention.

FIG. 1 illustrates an example of an electromagnetic measurement method according to a first embodiment of the present invention. As illustrated in FIG. 1, a probe 2 serving as an electromagnetic field sensor receives electromagnetic interference from a device under test (hereinafter, referred to as "DUT") 1 generating electromagnetic waves, such as an electronic device. And an electromagnetic measurement apparatus 3 measures the electromagnetic interference. It is sufficient that the probe 2 receives electromagnetic interference or radio waves exerting adverse influences on peripheral devices and human bodies. The probe 2 used herein has directivity that a received band is widened in accordance with a measurement distance. Examples of the probe 2 include a loop antenna and an infinitesimal dipole antenna. However, the probe 2 is not limited to these examples.

Measurement is mainly performed within an electromagnetic near range (in general, radian sphere=wavelength/$2\pi$ radian). Preferably, a measurement distance D from the DUT 1 to the probe 2 has an upper limit value of, for example, 50 mm in consideration of a minimum resolution. A received band A is obtained in accordance with the measurement distance D and directivity. As the measurement distance D becomes short, the received band A becomes narrow. In order to measure a whole area of a range to be measured A0 in the DUT 1, the received band of the probe 2 is sequentially shifted to the whole area of the range to be measured A0. That is, scans in X and Y directions are increasingly performed many times. More specifically, the number of scans is a square root of an inverse of a ratio that a measurement distance becomes short. In light of a range capable of obtaining a sufficient measurement resolution without increasing the number of scans, the measurement distance D effectively has a lower limit value of about 5 mm.

Figure 2:
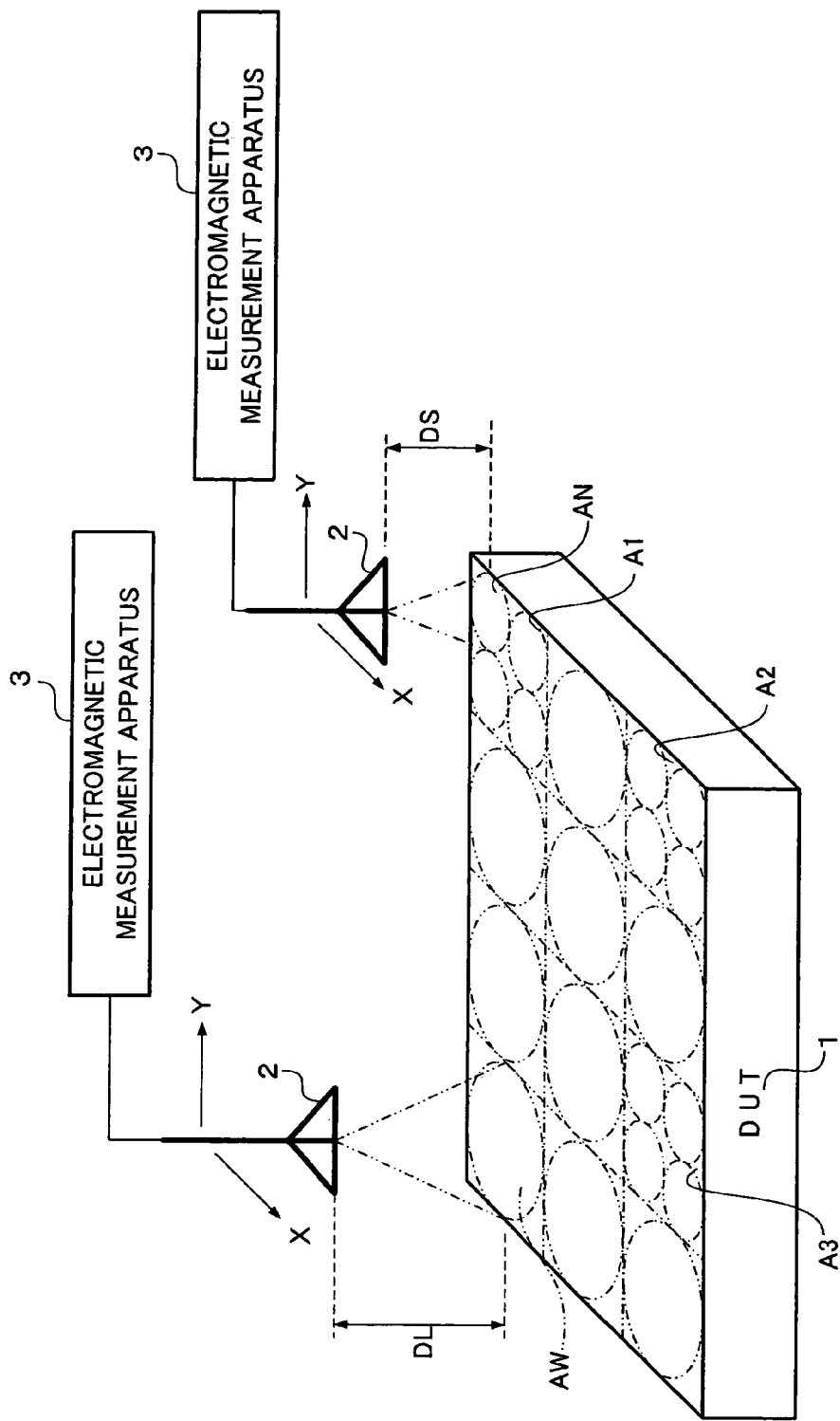
FIG. 2 is a perspective view illustrating an example of a measurement state by a narrow-range scan adopted by the electromagnetic measurement method and the electromagnetic measurement apparatus according to the first embodiment of the present invention.

Based on a relation among the measurement distance D, the width of the received band A, and the number N of scans, a plurality of measurement distances DS and DL are set in this embodiment as shown by P1 and P2 in FIG. 2. Scans are performed in X and Y directions at the long measurement distance DL (e.g., 50 mm) shown by P1, that is, wide-range scans are performed. Then, scans are performed in X and Y directions at the short measurement distance DS (for example, 5 mm) shown by P2 plural times, that is, narrow-range scans are performed plural times. Measurement by the narrow-range scan at the short measurement distance DS is performed on received bands A1, A2 and A3 in which electromagnetic interference is measured at the long measurement distance DL.

As described above, in a case of using the measurement distances DS and DL set within the electromagnetic near range, the wide-range scan at the long measurement distance DL can reduce the number of movements of the probe 2 and the number of scans on the range to be measured A0 because of the wide received band AW, that is, N=m=12, and the range to be measured A0 on the electromagnetic radiation area of the DUT 1 is subjected to measurement. As a result, the received bands A1, A2 and A3 in which an electromagnetic interference is measured are identified without oversight. Relative to the received bands A1 to A3, measurement is performed by the narrow-range scan at the short measurement distance DS with high resolution. However, an area to be measured is limited to the received bands A1, A2 and A3, that is, N=3. Therefore, measurement can be performed in a short time although a received band area As is small. Accordingly, it is possible to measure generation of electromagnetic interference and a generation position of the electromagnetic interference at a high speed with high accuracy. A feature thereof can be exhibited at maximum when the long measurement distance DL is set at the upper limit value of 50 mm and the short measurement distance DS is set at the lower limit value of 5 mm.

As described above, by appropriately utilizing a difference in resolution between the measurement distances DS and DL, the number of scans for measurement is reduced without lowering a degree of measurement accuracy, that is, N=n+m=15; thus, a measurement speed can be made high. As a result, measurement with high accuracy can be achieved in a short time; thus, it is possible to offer a product having high safety for peripheral devices and a human body at a low cost.

Herein, as the number of repetitions of measurement by the aforementioned relation at the different measurement distances D is increased, a degree of accuracy is improved. A plurality of measurement distances are set within the range between 50 mm and 5 mm.

Figure 3:
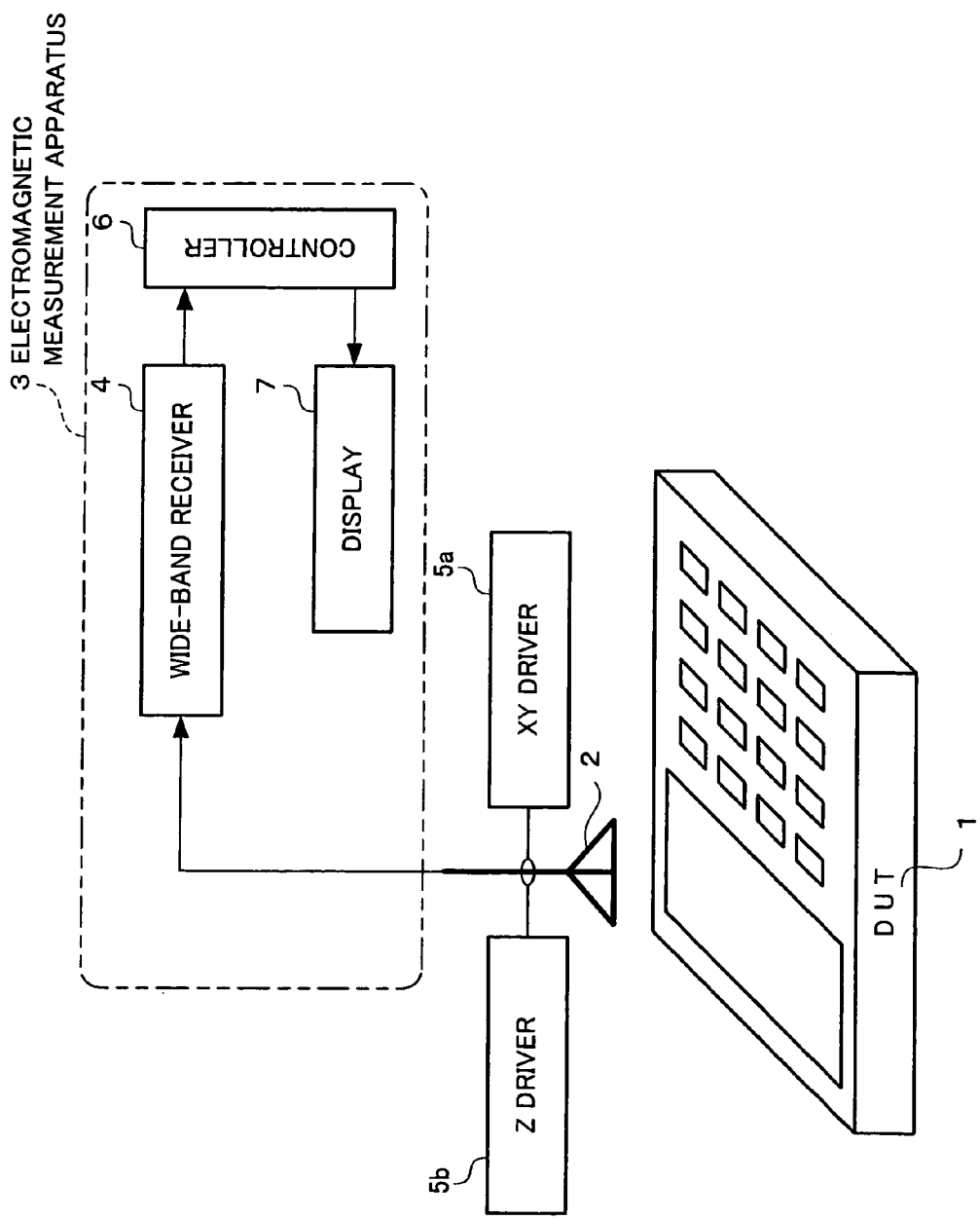
FIG. 3 is a block diagram illustrating one example of the electromagnetic measurement apparatus according to the first embodiment of the present invention.

As illustrated in FIG. 3, the electromagnetic measurement apparatus 3 that achieves the aforementioned method includes the probe 2 having a directivity that a received band is widened in accordance with the measurement distance D and receiving electromagnetic waves from the DUT 1, a wide-band receiver 4, such as a wide-band receiving circuit, for receiving the electromagnetic information transmitted from the probe 2 and processing the electromagnetic information, an XY driver 5a for scanning, which allows the probe 2 and the DUT 1 to relatively move in X and Y directions for each received band unit, a Z driver 5b for measurement distance change, which sets a plurality of measurement distances D between the probe 2 and the DUT 1, that is, allows the probe 2 and the DUT 1 to move in a Z direction, a controller 6 for performing data processing on the received electromagnetic information processed by the wide-area receiver 4a, and performing a measurement at a long measurement distance and a measurement at a short measurement distance plural times, and a display 7. In the controller 6, the measurement at the short measurement distance is performed on a received band in which electromagnetic interference is measured at the long measurement distance.

Figure 4:
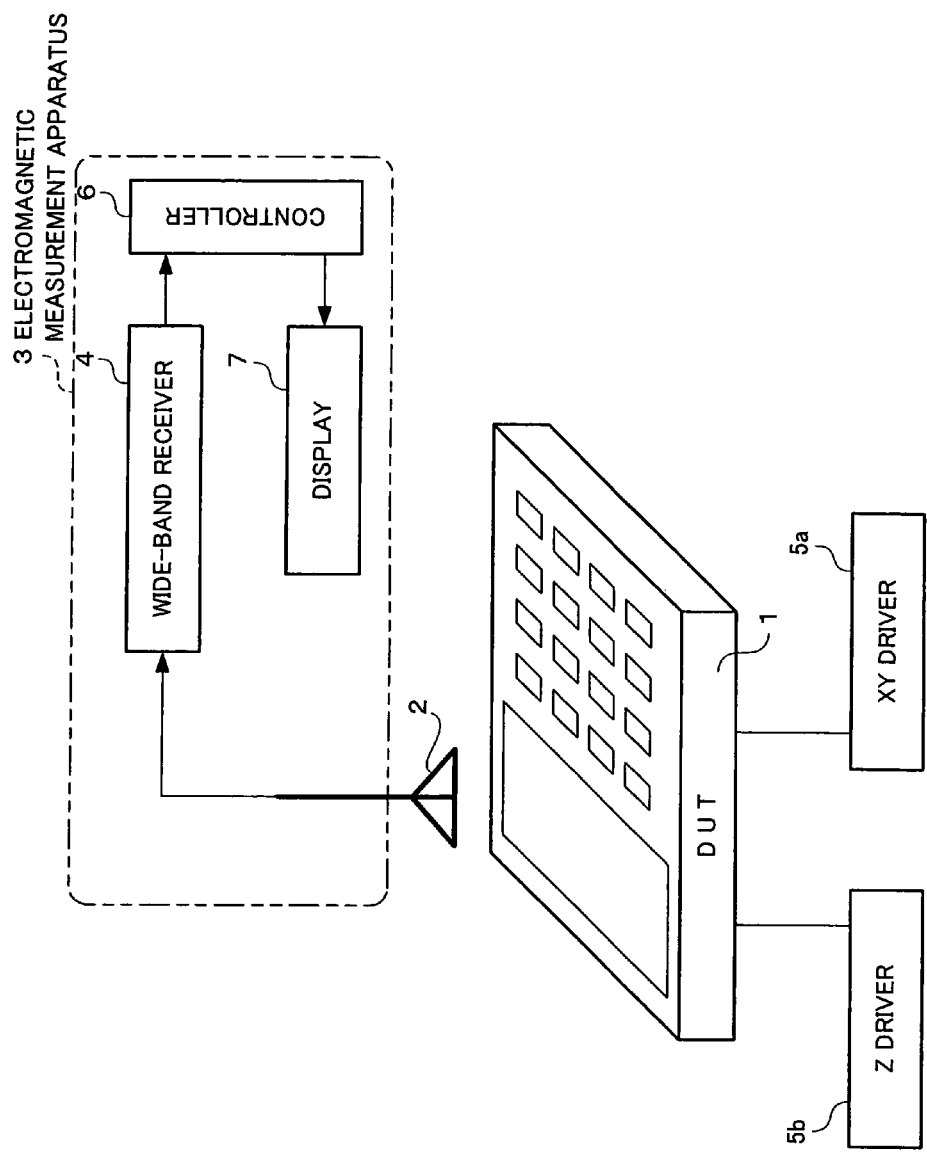
FIG. 4 is a block diagram illustrating another example of the electromagnetic measurement apparatus according to the first embodiment of the present invention.

The wide-band receiver 4 receives and processes electromagnetic interference generated within a range of a wide band. Each of the XY driver 5a and the Z driver 5b allows the probe 2 to move in the X and Y directions and to scan the DUT 1. However, as illustrated in FIG. 4, the DUT 1 may move in the X and Y directions so as to be scanned by the probe 2. In principle, the probe 2 and the DUT 1 may share movement in the X, Y and Z directions. The controller 6 controls operations of the probe 2, the wide-band receiver 4, the XY driver 5a, the Z driver 5b and the display 7 in order to measure and evaluate electromagnetic interference.

Figure 5:
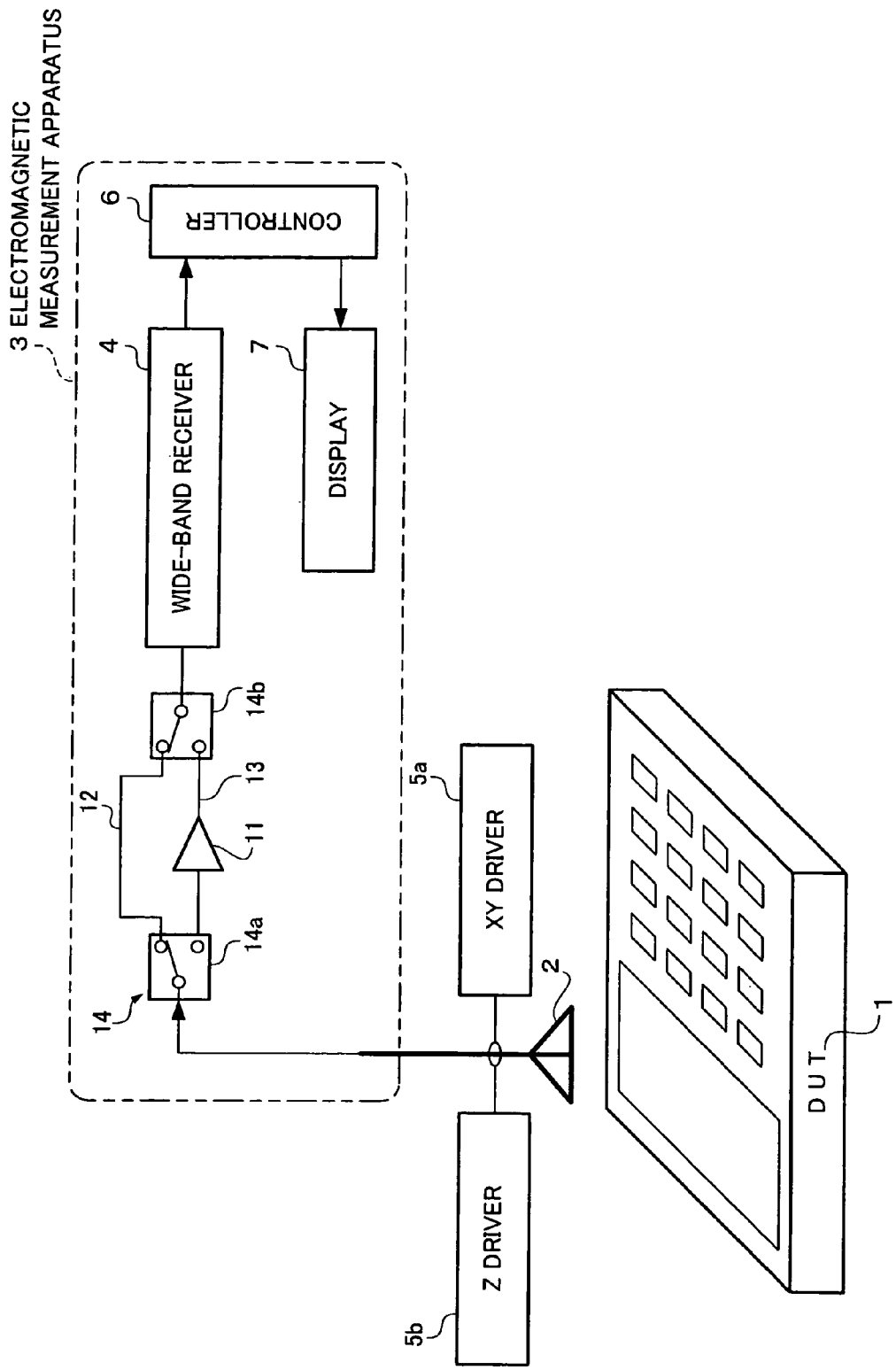
FIG. 5 is a block diagram illustrating still another example of the electromagnetic measurement apparatus according to the first embodiment of the present invention.

Further, if the probe 2 has a low reception level of electromagnetic interference and the reception level is out of a reception dynamic range of the wide-band receiver 4, as illustrated in FIG. 5, an amplifier 11 is provided between the probe 2 and the wide-band receiver 4. The amplifier 11 amplifies information transmitted from the probe 2, and outputs a resultant to the wide-band receiver 4. However, if an amplification ratio is made high, an SN ratio lowers; therefore, the amplification ratio is preferably set at about 6 dB. Preferably, the amplifier 11 is not used because a degree of measurement accuracy is enhanced as much as possible. As illustrated in FIG. 5, the electromagnetic measurement apparatus 3 may include a switching part 14 for selecting one of a through path 12 for directly outputting information received by the probe 2 to the wide-band receiver 4, and an amplifier path 13 for outputting information received by the probe 2 to the wide-band receiver 4 via the amplifier 11. With this configuration, the wide-band receiver 4 receives information received by the probe 2 through the amplifier path 13 via the amplifier 11 if necessary. Thus, the information within the reception dynamic range can be measured.

Herein, the switching part 14 includes a switch 14a and a switch 14b provided at an input side and an output side of the amplifier 11, respectively, for switching between connection and disconnection. If the through path 12 is selected, the amplifier 11 receives no electrical input at both input and output ends thereof. As a result, an electric field and a magnetic field generated by passing of current through the amplifier 11 are not generated in the electromagnetic measurement apparatus 3. In addition, an electric field by application of voltage is not also generated. Thus, it is possible avoid the following situation that such an electric field serves as a noise source when the amplifier 11 is out of use.

Herein, detailed description will be given of the measurement. It is assumed that the DUT 1 emits electromagnetic interference. The probe 2 receives the electromagnetic interference and outputs it to the wide-band receiver 4. The wide-band receiver 4 performs reception processing on the electromagnetic interference transmitted from the probe 2 at a frequency or an electric field level, and outputs a result to the controller 6. The controller 6 performs data processing on the frequency and the electric field level of the electromagnetic interference, and displays the data on the display 7. Intensity distribution for respective frequencies is displayed as a frequency spectrum as shown in FIG. 6.

Figure 6:
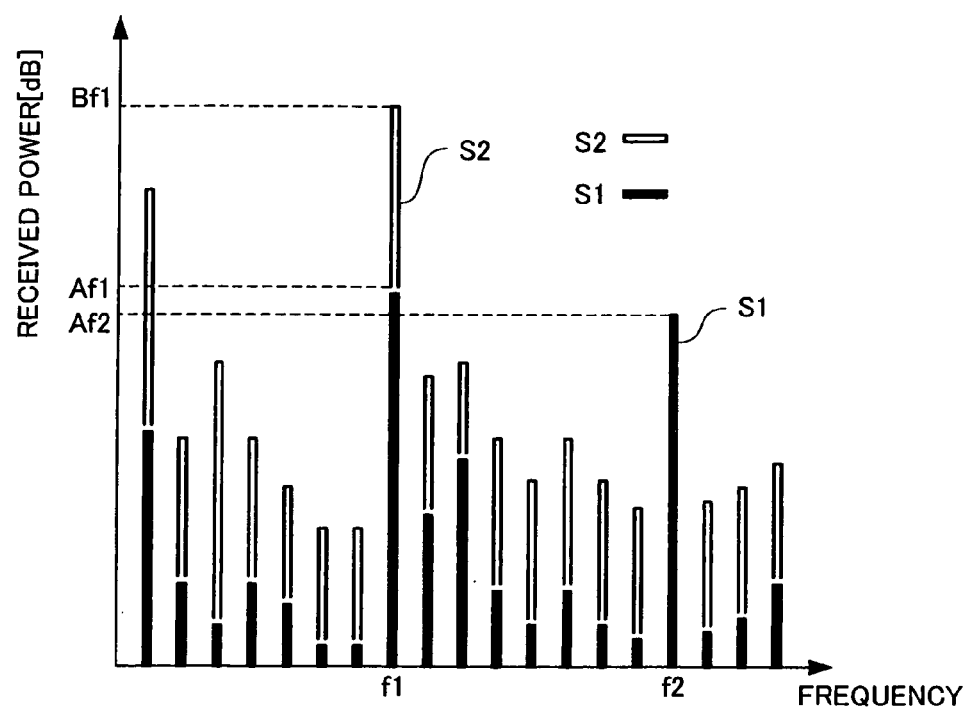
FIG. 6 is a graph that relates to intensity, for each frequency, of electromagnetic interference to be measured, and shows a comparison between examples of measurement data by a wide-range scan and examples of measurement data by a narrow-range scan.

As shown in FIG. 6, a spectrum of extraneous noise S1 is displayed in the measurement by the wide-range scan at the measurement distance DL, and the spectrum of the extraneous noise S1 and the electromagnetic interference S2 from the DUT 1 added thereto are displayed in the measurement by the narrow-range scan at the measurement distance DS.

Thus, intensities of electromagnetic interference exerting adverse influences on another device and a human body at a specific frequency can be determined respectively, and an intensity higher than a predetermined value is treated as a problem.

In order to solve the problem, it is necessary to identify an emission source in the DUT 1, such as an electronic component, a circuit or another device. Electric field intensity distribution can be displayed as a streak pattern of a contour line type that distribution area having a single level are distinguished by at least one of different colors, shading, and lines on an XY coordinate shown in FIG. 7. If necessary, values indicating the intensities may be added.

Figure 7:
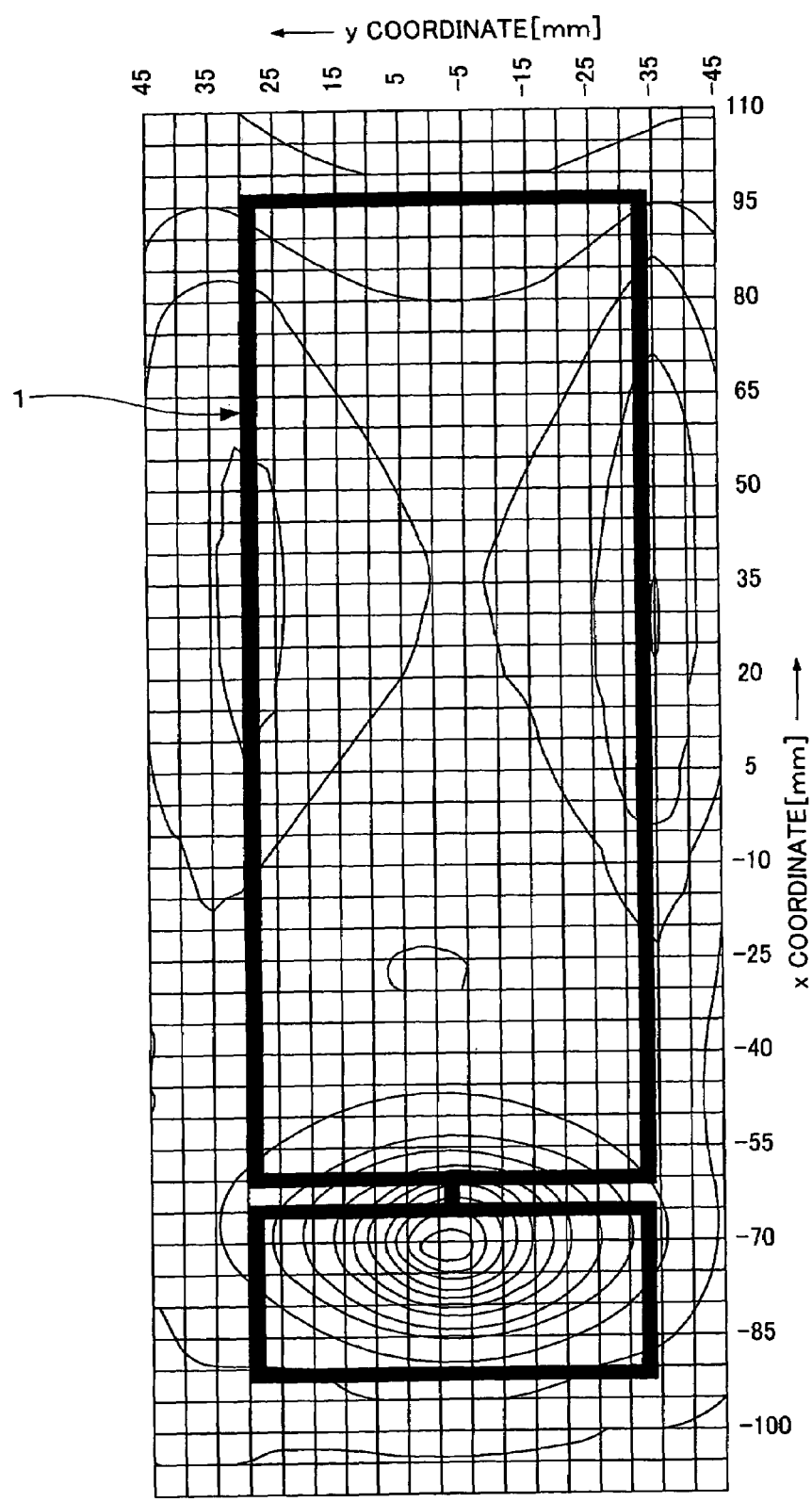
FIG. 7 is graph showing distribution of XY intensities of electromagnetic interference at a specific frequency to be measured.

With this display of the electric field level, it is possible to determine a site and a position where a high electromagnetic field is generated on the XY coordinate in the DUT 1. By making the measurement distance D short, even when a plurality of electronic generation sources are present, accurate measurement can be performed on each electronic generation source. The electromagnetic field intensity distribution is displayed as shown in FIG. 7 for each frequency having the aforementioned electric field intensity; thus, a generation source can be identified. FIG. 7 shows a case that a plate-shaped dipole antenna is used as the DUT 1, and shows electromagnetic near field distribution at a frequency of 900 MHz. In FIG. 7, a contour line is drawn for each 50 mA/m in a magnetic intensity range of 0 to 700 mA/m.

If intensity distributions for the respective frequencies are displayed concurrently while they are color-coded on the XY coordinates or the XYZ coordinates with a Z direction as an intensity, a problematic frequency and a generation source thereof can be evaluated concurrently. In this case, evaluation can be readily performed if types of frequencies of electromagnetic are small in number and generation positions are overlapped with each other. In view of this point, it is convenient for measurement to display only electromagnetic interference that is within a threshold range for each problematic frequency.

Particularly, in the frequency spectrum shown in FIG. 6, a measurement result in the wide-range scan is blacked out, and a measurement result in the narrow-range scan is whited out. As shown in FIG. 6, there are a type of a measurement value that a measurement value Bf1 in the narrow-band scan is extremely increased as compared with a measurement value Af1 in the wide-range scan, and a type of a measurement value that a measurement value Af2 in the wide-range scan hardly varies also in the narrow-range scan. This means the following facts. If the probe 2 receives electromagnetic from the DUT 1 in a range of an electromagnetic near field, a measurement value varies by the variation of the measurement distance D. On the other hand, if the probe 2 receives electromagnetic from a farfield (generally, a distance three times longer than a wavelength), there is no influence even when the measurement distance D relative to the DUT 1 varies.

This extraneous noise determination is performed by comparing measurement values having different measurement distances with each other, like the long measurement distance DL in the wide-range scan and the short measurement distance DS in the narrow-range scan. Therefore, the extraneous noise can be determined at the time of allowing the probe to approach the DUT upon start of measurement. As described above, even when electromagnetic interference is detected in the narrow-range scan, if the electromagnetic interference does not vary from the detection level upon detection in the wide-range scan, such is determined as extraneous noise from a far field. Thus, this is excluded from the measurement data from the DUT 1, so that measurement accuracy can be enhanced.

Figure 8:
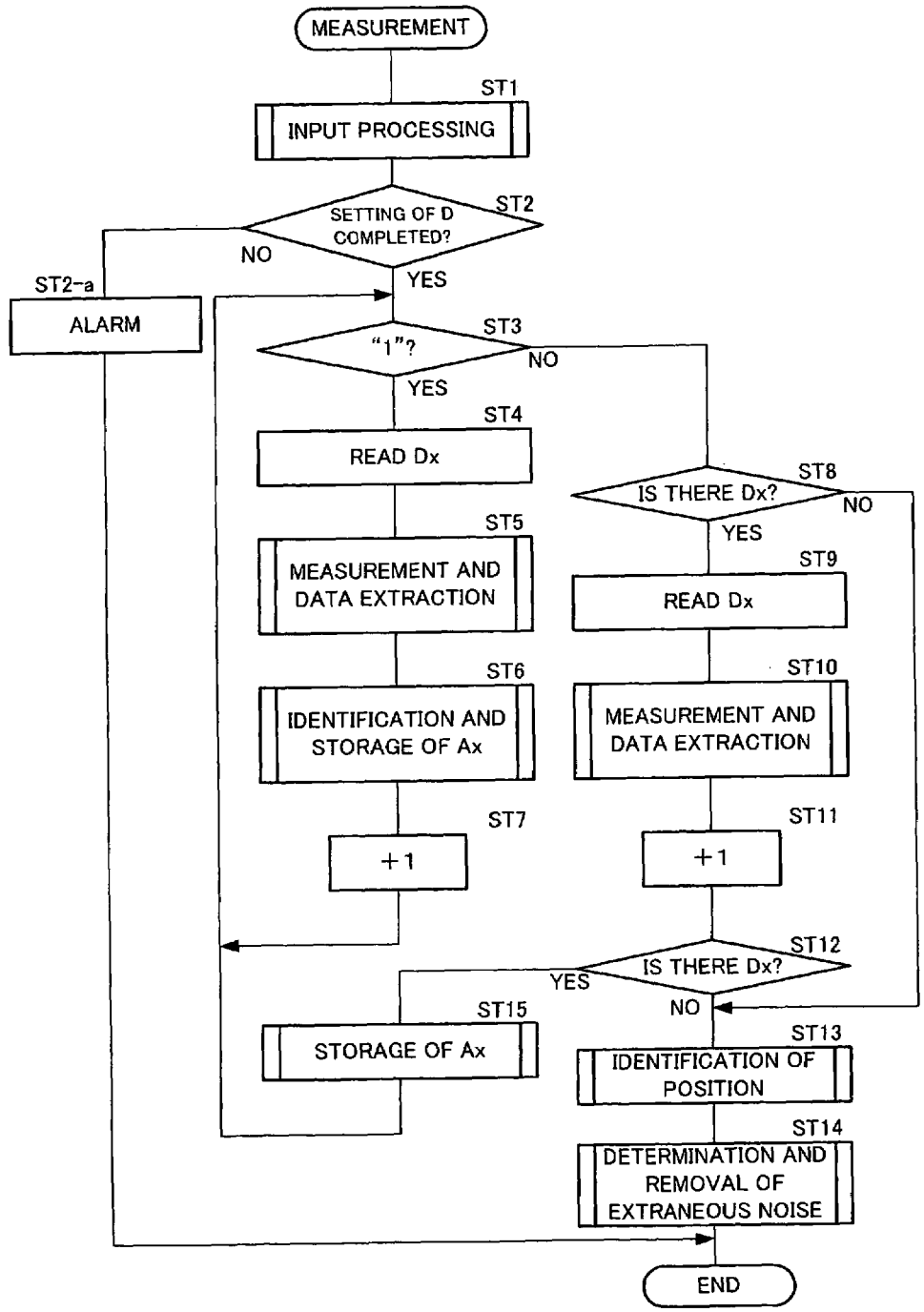
FIG. 8 is a flowchart showing an example of measurement control.
Figure 9A:
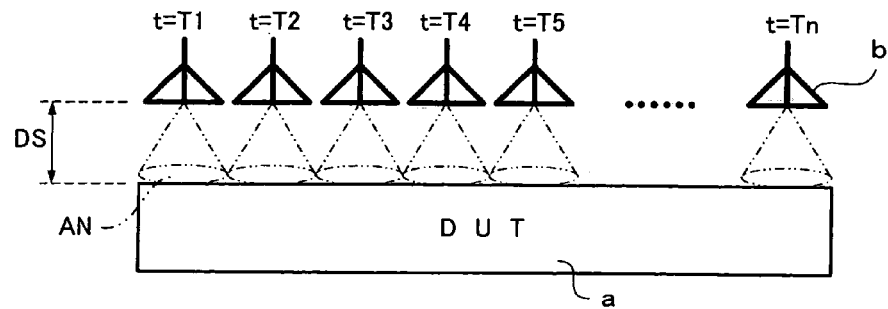
FIG. 9A is a front view in a case of measuring electromagnetic interference by a narrow-range scan by use of a probe with specific directivity.
Figure 9B:
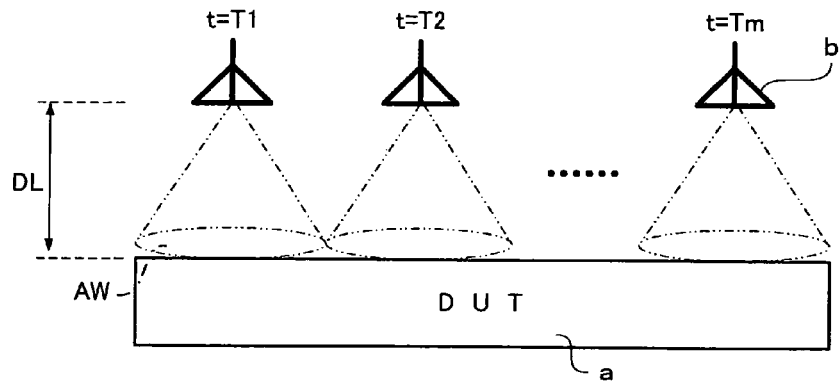
FIG. 9B is a front view in a case of measuring electromagnetic interference by a wide-range scan by use of the probe.
Figure 9C:
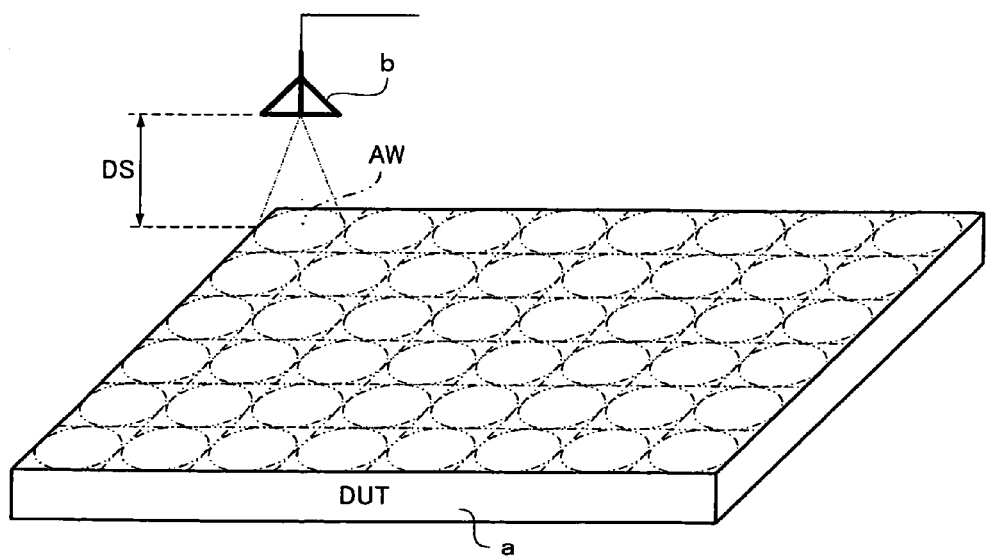
FIG. 9C is a perspective view illustrating an XY operation state in the narrow-range scan.

Specific measurement procedures are optional. Hereinafter, description will be given of one example of measurement control by the controller 6 with reference to FIG. 8.

First, input processing is performed in step ST1.

This includes processing for a start operation, and also includes processing for an operation for setting a plurality of measurement distances D performed by a user. At least two (long and short) measurement distances must be set as the measurement distances D.

In step ST2, completion of measurement distance setting is determined by a completion operation based on whether a measurement distance setting operation is not performed for a certain time. Upon completion of the setting of the not less than two measurement distances D, the measurement distances are ranked from longer one. An order counter is set at "1". The procedures proceed to step ST3 in accordance with the start operation.

In a case that the setting of the measurement distances D is completed and the start operation is performed, but the number of measurement distances D to be set is not less than two, this case is detected in step ST2, and an alarm is given as for this case in step ST2-a.

In a case that initial setting is performed or not less than two measurement distances D changed after the initial setting are set, if the start operation is performed without setting for a certain period of time, the order counter is set at "1" and, then, the procedures proceed to step ST3.

Even in a case that the initial setting is performed or not less than two measurement distances D changed after the initial setting are set, a setting operation is performed without start operation, the exiting setting is cleared, and new setting is accepted in the aforementioned procedures.

If it is determined that the order counter is set at "1" in step ST3, the procedures proceed to step ST4. Then, a setting measurement distance Dx (x=1) of order 1 corresponding to "1" of the order counter is read. In step ST5, electromagnetic interference is measured and measurement data is extracted by the XY wide-range scan in the whole region of the range to be measured A0 at the measurement distance Dx (x=1). Resultants in step ST5 are stored in step ST6. In step ST7, the order counter is incremented by one and, then, the procedures return to step ST3. Herein, since the order counter is set at "2", the procedures proceed to step ST8 from step ST3. In step ST8, it is determined that there is the setting measurement distance Dx corresponding to the order counter. If the order counter is set at "2" and there is a setting measurement distance Dx (x=2) of order 2 corresponding thereto, the procedures proceed to step ST9.

In step ST9, a setting measurement distance Dx (x=2) of order 2 corresponding to "2" of the order counter is read. In step ST10, the order counter is decremented by one at the measurement distance Dx (x=2), and the narrow range scan is performed only on a received band Ax (x=1 to n) wherein an electromagnetic interference is measured by the XY wide-range scan. In the narrow-range scan, electromagnetic interference is measured more accurately as compared with the previous wide-range scan. Then, measurement data is extracted and stored.

Next, the procedures proceed to step ST11. Herein, the order counter is incremented by one. In step ST 12, it is determined whether there is a setting measurement distance Dx (x=3) of order 3 corresponding to "3" of the order counter. If there is no setting measurement distance, the measurement is completed. In step ST13, the measurement data is displayed in a form corresponding to the evaluation; thus, electromagnetic interference and a generation site thereof are identified. In step ST14, data having an unintentional electromagnetic data value without not less than predetermined variation among a plurality of pieces of data at the plurality of measurement distances Dx is deleted from unintentional electromagnetic data measured as extraneous noise and, then, the measurement is completed.

The identification of the electromagnetic interference and the generation site thereof in step ST13 and the determination of deletion of the extraneous noise in step ST14 are automatically performed; however, in place thereof or together therewith, a user may perform from data display.

In step ST12, if there is a setting measurement distance Dx (x=3) of order 3 corresponding to "3" of the order counter, the procedures proceed to step ST15. Then, the received band Ax where electromagnetic interference is detected by the narrow-band scan at the setting measurement distance Dx (x=2) corresponding to "2" of the order counter is identified and stored. The procedures return to step ST3. In step ST3, the measurement by the narrow-band scan is repeated until the setting measurement distance Dx is lost. Thus, the measurement can be performed with high accuracy.

In a case that the measurements corresponding to at least two setting measurement distances Dx are performed, the determination of the extraneous noise in step ST14 is performed with a plurality of pieces of measurement data at the longest and shortest measurement distances Dx.

As described above, the measurement by the wide-range scan is performed on the whole region of the range to be measured A0 in advance and, then, the measurement by the narrow-range scan is performed on only the received band where electromagnetic interference is measured by the previous wide-range scan. However, the measurement by the wide-range scan is performed on the whole region of the range to be measured A0 in advance and, then, every time electromagnetic interference is measured, the measurement by the narrow-range scan is performed on the received band at this time. If there is no electromagnetic interference, the scan is shifted to the next received band so that the measurement by the wide-range scan is continuously performed.

Second Embodiment

FIGS. 10 to 15B show and illustrate a second embodiment of the present invention.

Figure 10:
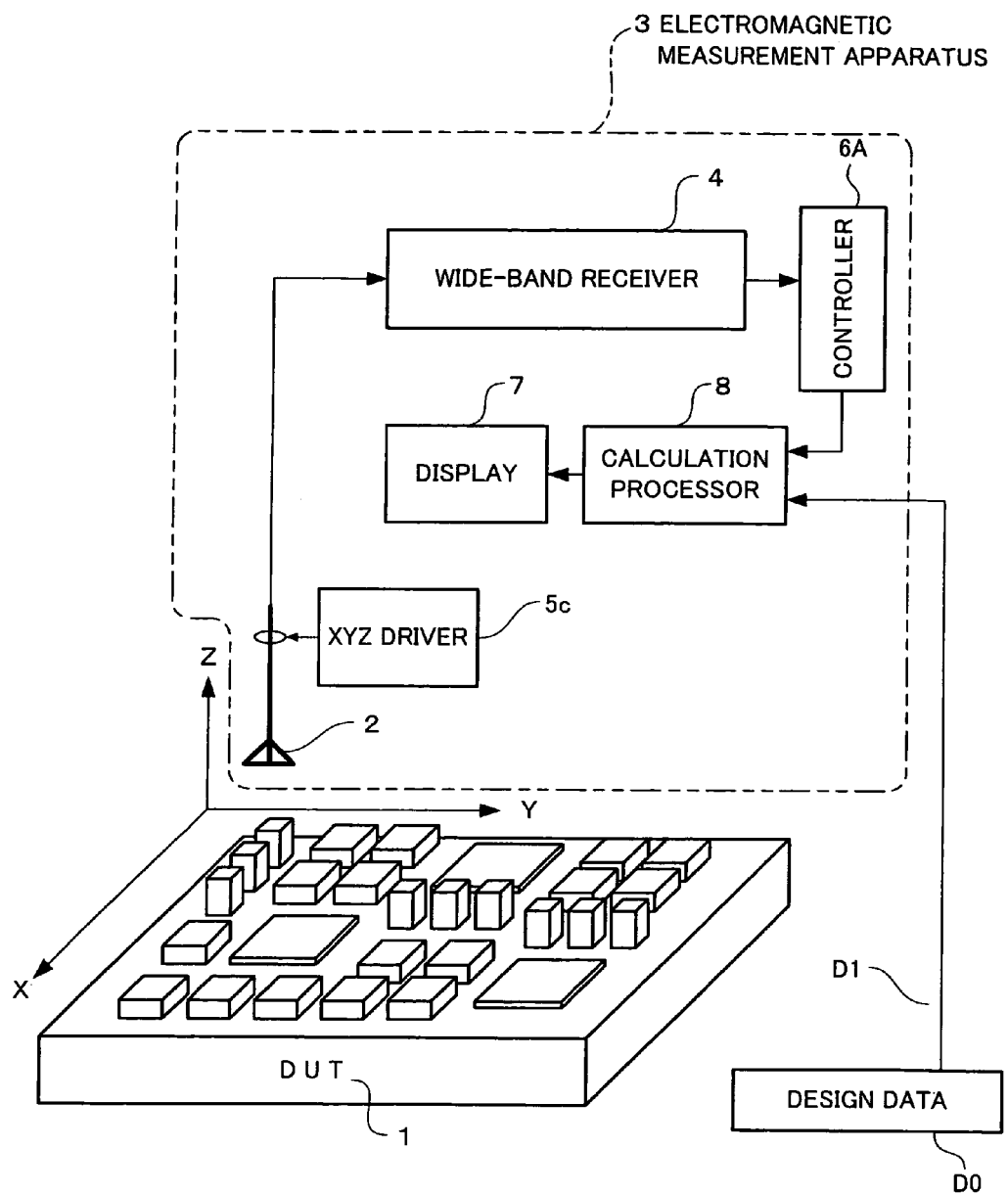
FIG. 10 is a configuration diagram illustrating an electromagnetic measuring apparatus according to a second embodiment of the present invention.
Figure 11:
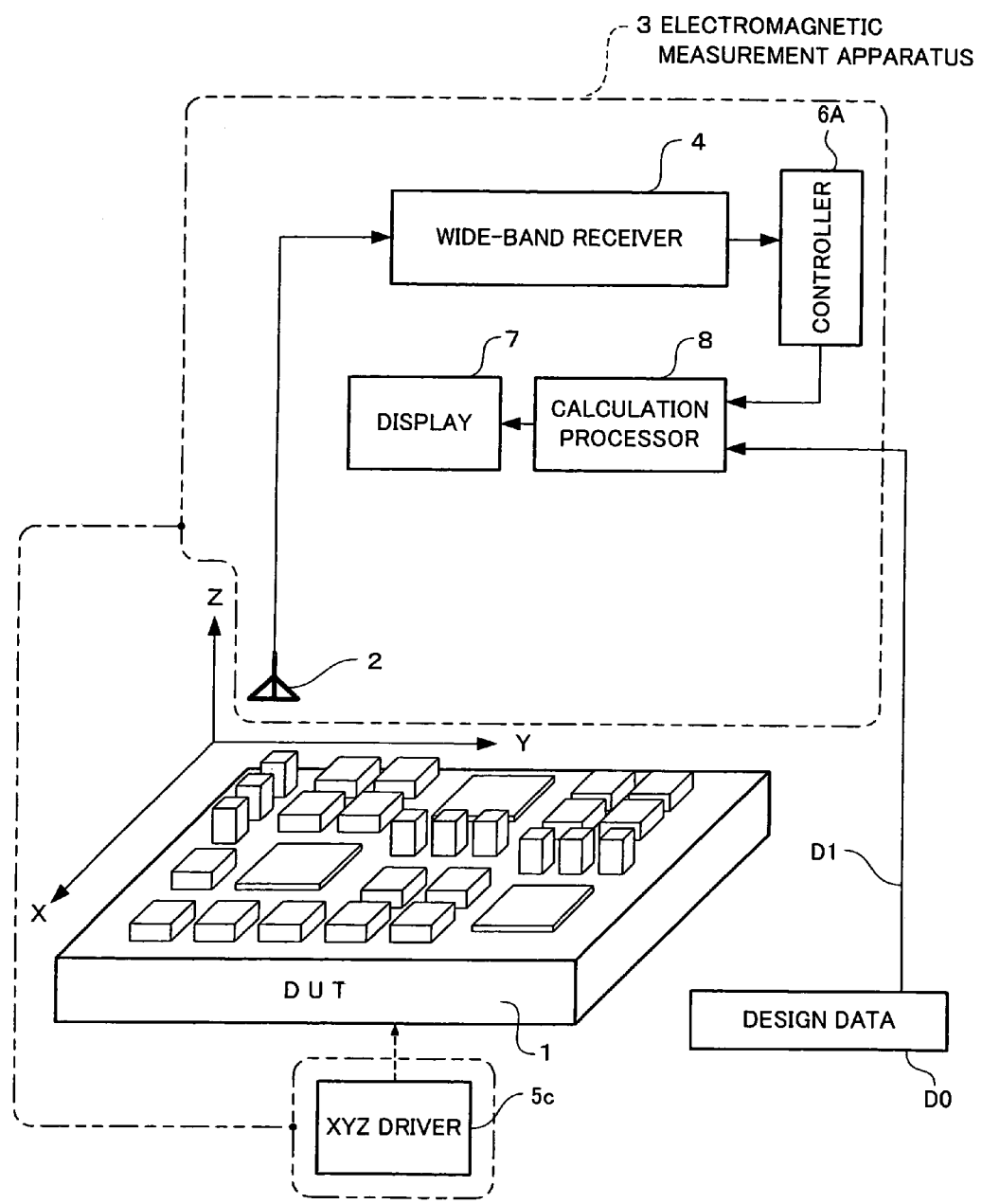
FIG. 11 is a configuration diagram illustrating another example of the second embodiment.

FIG. 10 illustrates an electromagnetic measurement apparatus 3 according to the second embodiment of the present invention. The electromagnetic measurement apparatus 3 allows an electromagnetic field sensor to move within a measurement plane spaced away from a DUT, which is formed based on design data, by a predetermined distance to measure an intensity of an electromagnetic field at each coordinate point in the measurement plane.

The electromagnetic measurement apparatus 3 includes a probe 2, a wide-band receiver 4, a controller 6A, a display 7 and a calculation processor 8. The probe 2 is an electromagnetic field sensor for receiving electromagnetic from a DUT 1.

The wide-band receiver 4 is a reception processing part having an amplifier, a mixer and the like and performing reception processing on the electromagnetic transmitted from the probe 2.

The controller 6A performs data processing on the electromagnetic wave component received and processed by the wide-band receiver 4 to measure the electromagnetic interference.

The calculation processor 8 is a calculation processing part using specification information (e.g., mechanism substrate information such as surface irregularity information, structure information and material information) D1 of the DUT 1 extracted from design data (e.g., CAD data of the DUT 1) D0 of the DUT 1 to perform calculation processing, that is, current estimation on the electromagnetic interference measured by the controller 6A. The display 7 displays various results each subjected to calculation processing by the calculation processor 8.

Herein, an XYZ driver 5c is a scanning part for allowing the probe 2 to move in each of X, Y and Z directions with respect to the DUT 1.

In the electromagnetic measurement apparatus 3 illustrated in FIG. 10, the probe 2 is allowed to move with respect to the DUT 1 generating electromagnetic, such as an electronic device. As illustrated FIG. 11, however, the XYZ driver 5c may allow the DUT 1 to move with respect to the probe 2 to measure electromagnetic generated by the DUT 1. Alternatively, both the DUT 1 and the probe 2 are allowed to move to thereby measure electromagnetic from the DUT 1. In the respective embodiments of the present invention, measurement is performed while changing a relative position between the DUT 1 and the probe 2.

Examples of the probe 2 include a loop antenna, an infinitesimal dipole antenna and the like. However, the probe 2 is not limited to these examples.

The electromagnetic measurement apparatus 3 extracts necessary specification information from design data, such as CAD data, regarding the DUT 1, and calculates an electromagnetic field intensity received based on the information. In this calculation, specification information about an electromagnetic source, obtained based on the specification information of the DUT 1, for example, information about a mechanism substrate, such as surface irregularities information, structure information and material information, is used, and the calculation processor 8 selects an appropriate current estimation equation corresponding to the specification information. Preferably, a plurality of current estimation equations are prepared in correspondence with a plurality of pieces of specification information in advance (to be described later).

Examples of the information include pattern information and material information about a printed board, mechanism information about a metal part such as a shield, and the like.

Herein, description will be given of one example of a case of measuring a magnetic field with reference to FIGS. 12A, 12B and 12C.

Figure 12A:
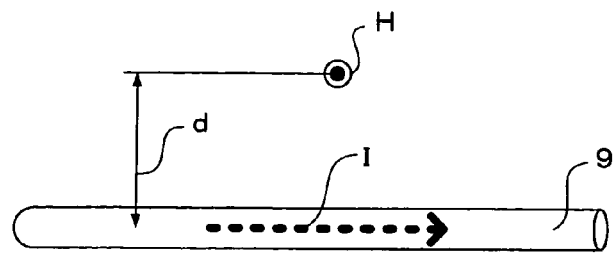
FIGS. 12A, 12B and 12C illustrate a difference in current estimation equation by a structure of a current source in the second embodiment.

As illustrated in FIG. 12A, in a case of using a conductor 9 as a current source, based on the Ampere's law, an intensity H (A/m) of a magnetic field spaced away from a current source of a current value I (ampere) by a distance d (meter) is expressed by the following equation 1.

$$H = I/2 \cdot \pi \cdot d \tag{1}$$

The current value I of the current source can be estimated from a current estimation equation 2 by use of the measured magnetic field intensity H and the distance d between the measurement point and the probe 2.

$$I = 2 \cdot \pi \cdot d \cdot H \tag{2}$$

Figure 12B:
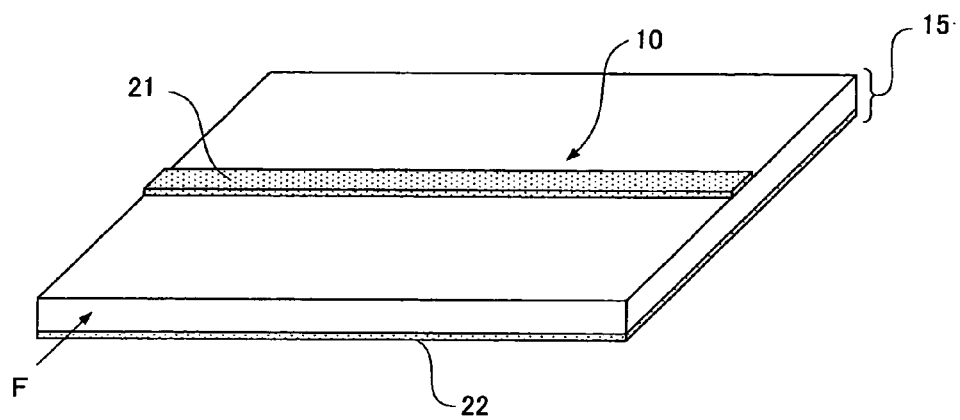

On the other hand, a case that a current source is a microstrip line 10 including a signal line 21 made of a conductor (e.g., a copper foil) formed on a front side of a double-sided substrate 15 as illustrated in FIG. 12B and a ground 22 made of a conductor (e.g., a copper foil) formed on a back side of the double-sided substrate 15 is as follows.

Figure 12C:
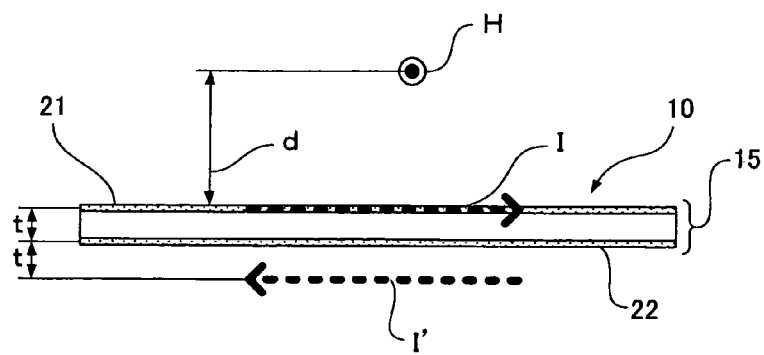

FIG. 12C illustrates the double-sided substrate 15 as a current source seen from an F direction in FIG. 12B. A magnetic field intensity H generated from the current source is obtained from a synthesis of a magnetic field generated by a current I on the signal line 21 of the microstrip line 10 and a magnetic field generated by a feedback current I' (referred to as a mirror image current; a magnitude thereof is equal to that of the current I) flowing at a position of a mirror image spaced away from the front side of the ground 22 of the microstrip line 10 to the back side by a distance t corresponding to the thickness of the substrate and, therefore, is expressed by the following equation 3.

$$H = (I/2 \cdot \pi \cdot d) + (I/2 \cdot \pi \cdot (d+2 \cdot t)) \tag{3}$$

Accordingly, in the case that the current source is the microstrip line 10, the current value I of the current source is estimated by a current estimation equation (4) from the measured magnetic field intensity H, the distance d between the measurement point and the probe 2, and the thickness t of the double-sided substrate 15 having the microstrip line 10 formed thereon.

$$I = \pi \cdot d \cdot (d+2 \cdot t) \cdot H/t \tag{4}$$

In the aforementioned current estimation equations (2) and (4), the distance d between the measurement point and the probe 2, and the thickness t of the substrate having the microstrip line 10 formed thereon are obtained by the calculation processor 8. For example, the calculation processor 8 performs calculation processing based on mechanism substrate information and the like such as surface irregularities information and structure information extracted from the CAD data of the DUT 1.

The aforementioned description is merely one example. Current estimation equations to be prepared differ depending on whether a DUT is a printed board or a conductor (such as a casing or a shield case).

A current estimation equation is selectively used based on the information of the measurement point; thus, currents can be estimated with high accuracy in the measurement area.

Figure 13A:
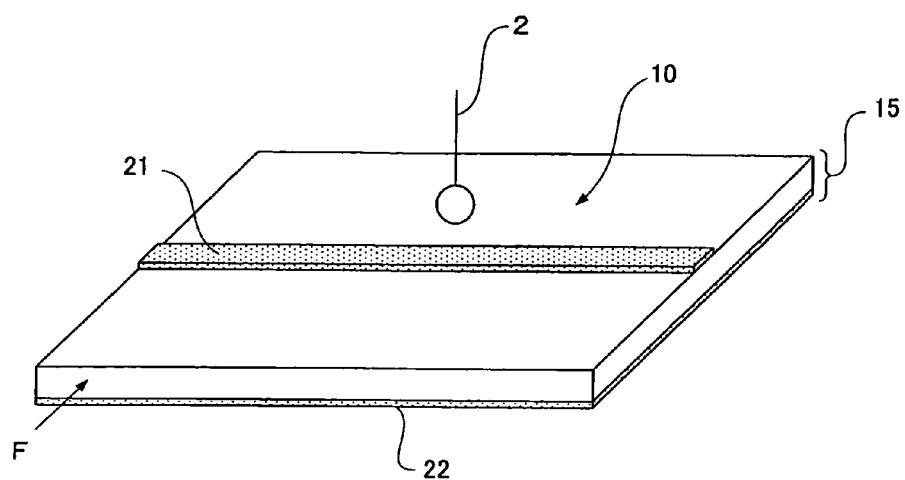
FIGS. 13A and 13B illustrate a case that a micro-strip line in the second embodiment is measured by a probe for magnetic field measurement.
Figure 13B:
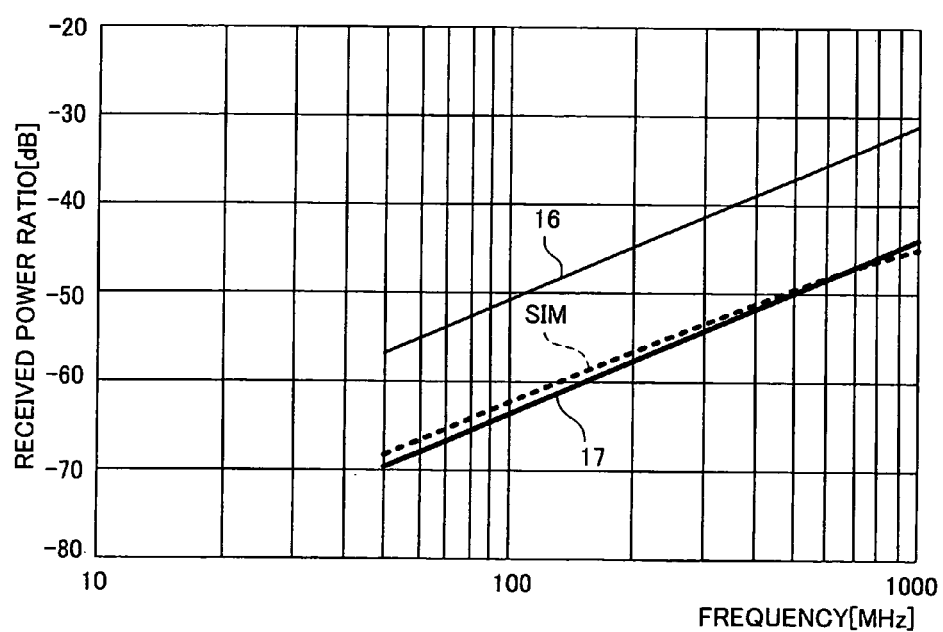

As illustrated in FIG. 13A, for example, FIG. 13B shows frequency characteristics of a magnetic field intensity in a case that a magnetic field near the microstrip line 10 is measured by the probe 2.

In FIG. 13B, a broken line shows an SIM as a result of simulation by a finite element method using the Maxwell's equation as theory of calculation, a thin line shows a result 16 calculated by the equation 2, and a bold line shows a result 17 calculated by the equation 4.

As described above, in a case that the DUT 1 is the microstrip line 10, the calculation processor 8 selects the equation 4 for the microstrip line 10, so that estimation more close to the theory of calculation can be performed with high accuracy.

Figure 14:
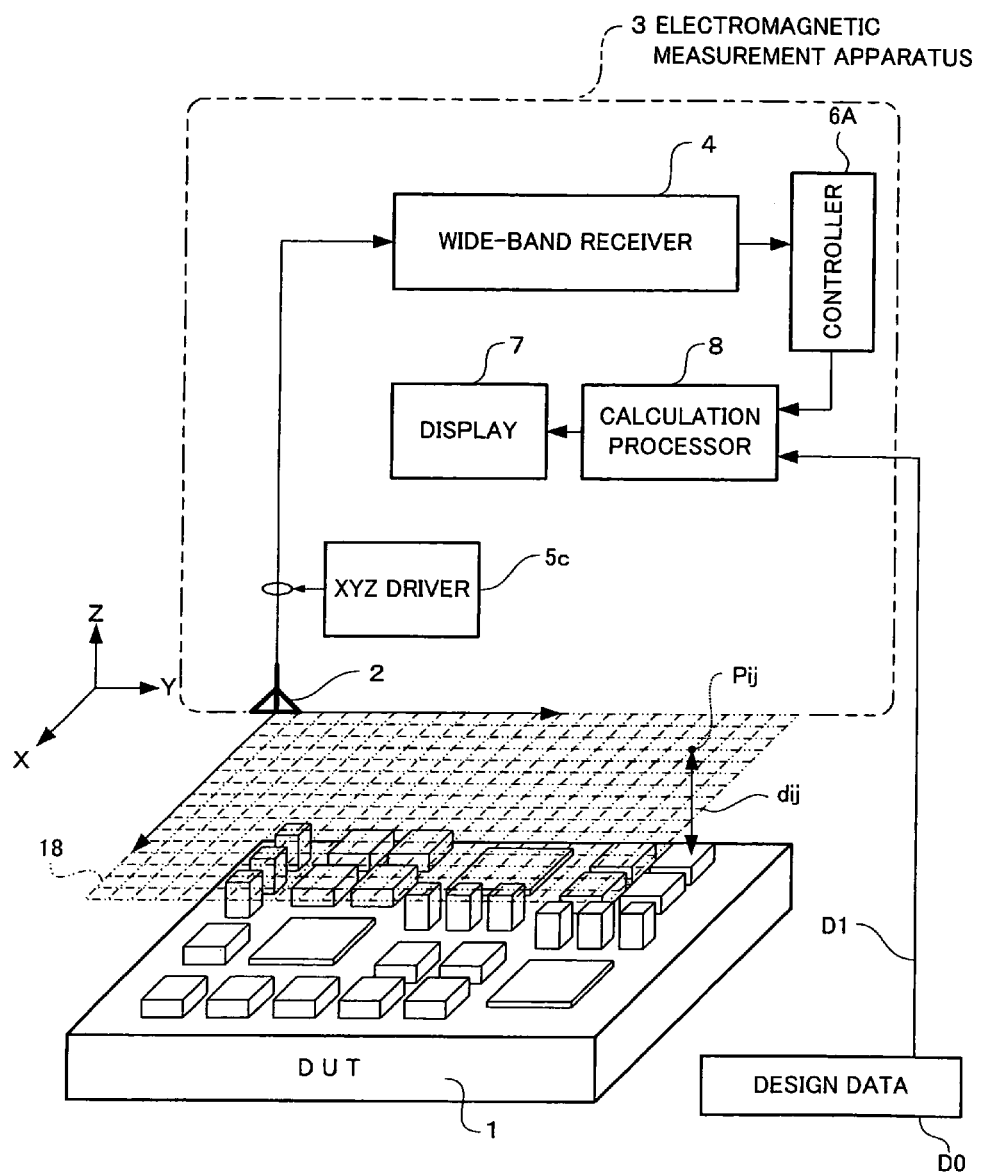
FIG. 14 illustrates a movement plane of a probe in the second embodiment.

The XYZ driver 5c allows the probe 2 to move in an XY plane 18 without shifting the Z direction as illustrated in FIG. 14. Next, description will be given of a method of extracting a distance d between each measurement point used for current estimation and an antenna probe from CAD data, with reference to FIGS. 15A and 15B.

Figure 15A:
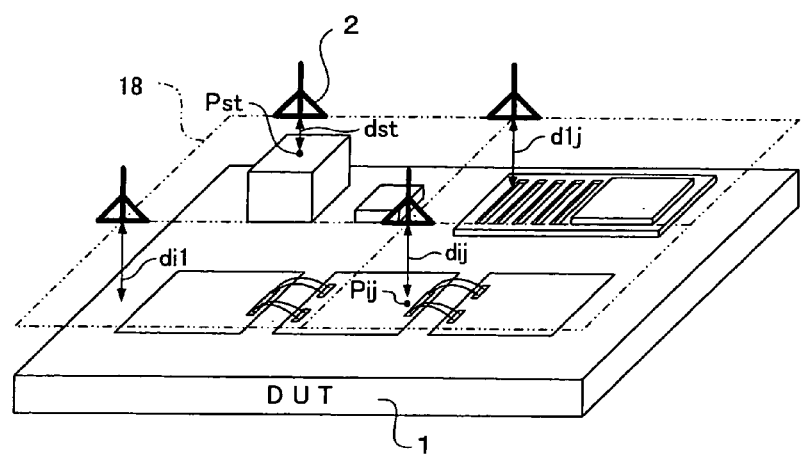
FIGS. 15A and 15B illustrate a method of obtaining a distance between each measurement point and a probe based on irregularities information of a device under test in the second embodiment.
Figure 15B:
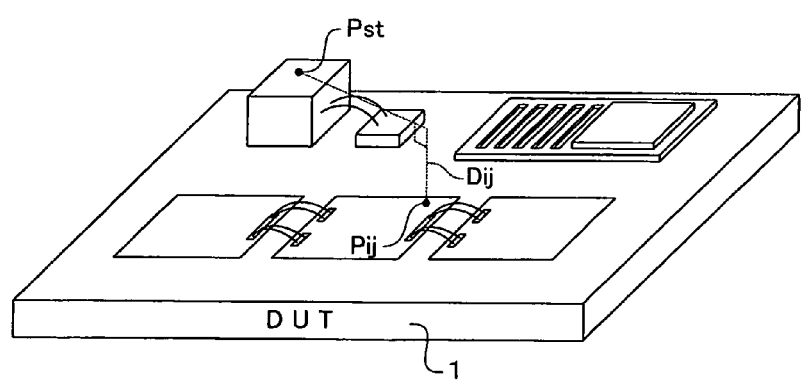

As illustrated in FIG. 15A, a reference point Pst of the DUT 1 is determined. In this case, desirably, the most protruded point in the DUT 1 is determined as the reference point Pst. Next, as a lateral plane for actually measuring a magnetic field intensity, an XY plane 18 passing a position only at a reference measurement distance dst from the reference point Pst in the Z direction is determined. As illustrated in FIG. 15B, a relative distance Dij between each measurement point Pij and the reference point Pst is acquired in advance by using irregularities information of the DUT 1 extracted from design data such as CAD data. Herein, in a case of a component, an upper face thereof is determined as the measurement point Pij. In a case of a conductive wire, a center thereof is determined as the measurement point Pij. In a case of a wiring pattern on a substrate, a point on a pattern face is determined as the measurement point Pij.

Thus, using the relative distance Dij between the reference measurement distance dst and each measurement point Pij, the distance dij between each measurement point Pij and the probe 2 is expressed by the following equation 5.

$$dij = dst + Dij \tag{5}$$

Depending on whether a DUT is a printed board or a conductor (such as a casing or a shield case), current estimation equations to be selected differ. Therefore, the calculation processor 8 automatically selects a current estimation equation suitable for a type of a DUT based on specification information of the DUT. In accordance with a case that a current source is the conductor 9 or a case that a current source is the microstrip line 10, the distance d between a measurement point and the probe 2, the thickness t of the substrate having the microstrip line 10 formed thereon, and the like are obtained. Based on the selected current estimation equation, a current value I of a current source is calculated by the distance d and the thickness t. Thus, the current value of the current source can be estimated with good accuracy.

As described above, a flow of currents in a device under test is visualized by a current value at each coordinate point in a measurement plane estimated with high accuracy; thus, a source (a defective site to which countermeasures are made)

of electromagnetic (noise) is correctly grasped at a low cost and some countermeasures are made to the source.

Third Embodiment

In the second embodiment, a flow of currents in a device under test is visualized by a current value at each coordinate point in a measurement plane estimated with high accuracy; thus, an electromagnetic source is evaluated. In a third embodiment, a probe 2 is allowed to move in an XY plane 18 near a DUT 1 such as an electronic device to receive electromagnetic, and a calculation processor 8 evaluates an electromagnetic field intensity of the electromagnetic from the DUT 1 at a high speed; thus, a source (a defective site to which countermeasures are made) of electromagnetic (noise) is correctly grasped at a low cost and some countermeasures are made to the source.

In this case, measurement distances dij are different from each other depending on respective measurement points Pij. Therefore, received electromagnetic field intensities cannot be evaluated based on a single standard.

Also in this case, as in the second embodiment, the calculation processor 8 utilizes design data, such as CAD data, of the DUT 1, acquires a distance dij between each measurement point Pij and the probe 2 from surface irregularities information of the DUT 1 extracted from the design data (a calculation method of the distance dij is equal to that in the second embodiment; therefore, description thereof will not be given here). Then, the calculation processor 8 uses a relation among a prescribed correction equation (to be described later), the measured electromagnetic field intensity, and the distance dij between each measurement point Pij and the probe 2 to correct the electromagnetic field intensity received at each measurement point Pij to an electromagnetic field intensity in a case that a position at a equal distance from each measurement point Pij is assumed.

Thus, a difference in distance dij between each measurement point Pij and the probe 2 can be eliminated. Further, a reception intensity of an electromagnetic field in a case that distances dij are different from each other can be corrected. In addition, current distribution or electromagnetic field intensity distribution can be acquired with high accuracy.

Figure 16A:
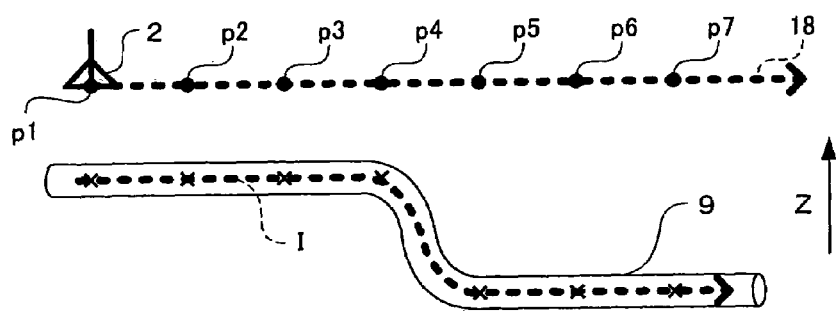
FIGS. 16A, 16B and 16C illustrate distance correction in a third embodiment of the present invention.

An electromagnetic field intensity at each measurement point can be corrected by a distance between each measurement point and the probe 2. This will be described with reference to FIGS. 16A, 16B and 16C. As shown in FIG. 16A, it is assumed herein that magnetic field intensities at measurement points p1 to p7 on an XY plane 18, each spaced away from each other by a certain distance from a conductor 9 having irregularities in a Z direction, are measured, and magnetic field intensity distribution is obtained.

Magnetic field distribution shown in FIG. 16 is a result that magnetic intensity distribution measured without distance correction by a distance dij from a measurement point of the conductor 9 serving as a current source to the probe 2 is expressed while a horizontal axis represents a measurement position in a measurement plane and a vertical axis represents a magnetic field intensity received by the probe 2.

As described above, the magnetic field distribution measured in accordance with the distance dij from the current source serving as an electromagnetic source to the probe 2 is changed. Therefore, even in a case of measuring a similar current source, contorted magnetic field intensity distribution is obtained in accordance with irregularities of the conductor serving as a current source.

Figure 16B:
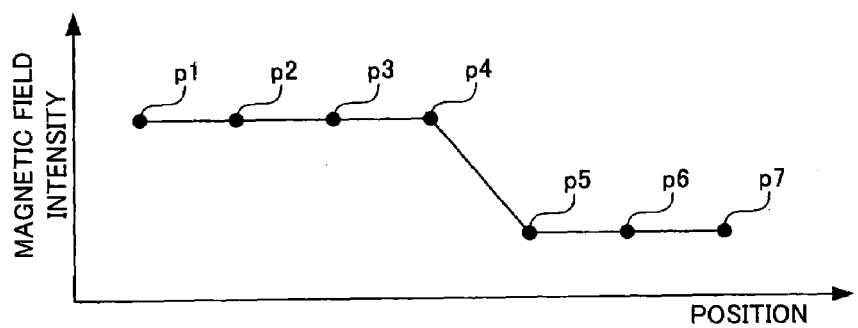
Figure 16C:
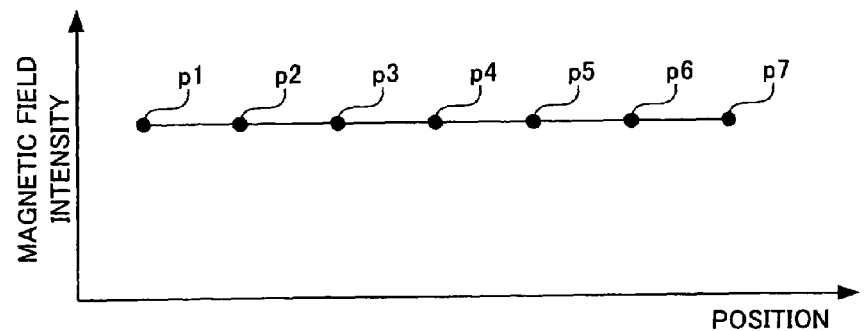

In contrast, magnetic field intensity distribution shown in FIG. 16C is a result that the calculation processor 8 obtains a distance dij between each measurement point and the probe 2 by the equation 5, obtains a correction coefficient K ($K \propto dij$) relative to a magnetic intensity in a proportional relation based on the distance dij, and uses the correction coefficient K to express as a magnetic intensity subjected to distance correction with respect to the magnetic field intensity distribution shown in FIG. 16B. Herein, as the proportional relation ($K \propto dij$) between the distance dij and the correction coefficient K, a predetermined proportional relation equation is used for calculating a correction coefficient K in accordance with an obtained distance dij.

As described above, the magnetic field distribution is subjected to distance correction; thus, distortion of the magnetic field intensity distribution shown in FIG. 16B is eliminated. As a result, a constant single magnetic field intensity is exhibited at each measurement point.

This is the simplest example. When this technique is applied to a DUT having more complicated irregularities, an electromagnetic field intensity can be obtained without depending on the irregularities of the DUT.

An electromagnetic field (noise) intensity in a DUT can be evaluated with a fixed standard by the corrected electromagnetic field intensity. Therefore, a site where electromagnetic fields (noise) are generated in the DUT can be identified.

Fourth Embodiment

In the second embodiment, the specification information D1 of the DUT 1 is used for executing calculation processing for current estimation. In the third embodiment, the electromagnetic field intensity detected by the probe 2 is corrected by the specification information D1 of the DUT 1 so as to be evaluated. In a fourth embodiment, a calculation processor 8 estimates currents in electromagnetic interference measured by a controller 6A by the method described in the second embodiment by use of specification information D1 of a DUT 1, extracted from design data (e.g., CAD data) of the DUT 1. Further, the calculation processor 8 executes calculation processing for calculating an electromagnetic field intensity spaced at a specific distance based on the estimated current value at each measurement point.

With this configuration, unnecessary radiation from a DUT having a complicated surface structure can be detected with accuracy in a short time. Further, a defective site of the DUT, which is a cause of the unnecessary radiation, can be correctly grasped at a low cost.

Fifth Embodiment

Figure 17:
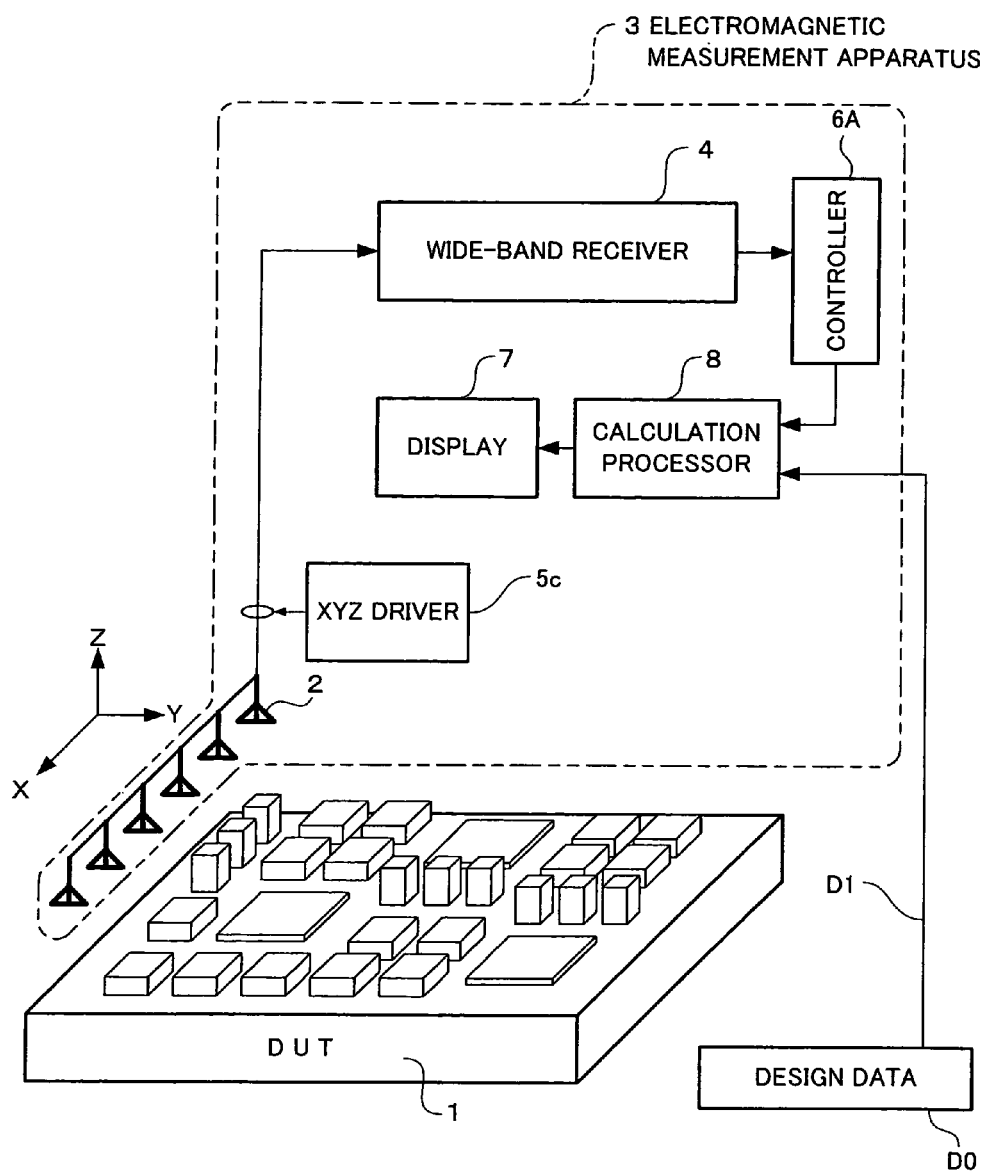
FIG. 17 is a configuration diagram illustrating an electromagnetic measurement apparatus according to a fourth embodiment of the present invention.

In the aforementioned respective embodiments, one probe 2 is used as an electromagnetic field sensor, and an XYZ driver 5c allows the probe 2 to move laterally on each coordinate in X and Y directions so as to cover the entire region in a DUT; thus, an electromagnetic field intensity from the DUT is measured for each coordinate point in the DUT. However, as illustrated in FIG. 17, a plurality of probes 2 are arranged on the respective coordinate points in the X direction as an electromagnetic field sensor, and an XYZ driver 5c allows the probes 2 to move in the Y direction concurrently.

In the conventional example that the probe 2 is allowed to move along the irregularities of the DUT in the Z direction to measure an electromagnetic field intensity, a failure is caused because the probe 2 can not be respond to irregularities on the respective coordinates in the X direction. However, according to the electromagnetic measurement method described in each of the aforementioned embodiments, only by allowing the probe to move laterally on the respective coordinates in the Y direction within a single plane, the probe covers the whole region of the measurement plane; thus, an electromagnetic field intensity from the DUT can be measured for each coordinate point in the measurement plane. Accordingly, a time required for measuring an electromagnetic field intensity can be further reduced in comparison with the aforementioned embodiments.

The present invention is applicable to measurement of electromagnetic interference in all devices generating electromagnetic waves, and can achieve high speed measurement.

What is claimed is:

1. A method of electromagnetic measurement, comprising:
   directing an electromagnetic field sensor having directivity, such that a received band is widened in accordance with a measurement distance toward a device under test; and
   receiving an electromagnetic wave from the device under test while shifting the received band in sequence to thereby detect electromagnetic interference,
   wherein a plurality of long and short measurement distances between the device under test and the electromagnetic field sensor are set,
   measurement at the long measurement distance is performed a plurality of times, and
   measurement at the short measurement distance is performed only on a received band where electromagnetic interference is detected by the measurement at the long measurement distance.

2. The method of electromagnetic measurement according to claim 1, wherein when the electromagnetic interference measured by the measurement at the long measurement distance is not increased by the measurement at the short measurement distance, the electromagnetic interference is determined as extraneous noise.

3. The method of electromagnetic measurement according to claim 1, wherein the electromagnetic interference to be measured is at least one of a frequency and an intensity of an electromagnetic wave in an electromagnetic near field.

4. A method for measuring electromagnetic interference, comprising:
   providing an electromagnetic field sensor having a directional detection field, such that a detection surface area of a test device increases as the electromagnetic field sensor moves farther away from the test device,
   setting the electromagnetic field sensor a first distance from the test device,
   detecting electromagnetic interference from a plurality of detection areas on the test device,
   setting the electromagnetic field sensor to a second distance from the test device shorter than the first distance from the test device,
   detecting electromagnetic interference at the second distance only in the detection areas in which electromagnetic interference was detected at the first distance.

5. The method according to claim 4, further comprising determining that electromagnetic interference is extraneous noise when the electromagnetic interference measured from a detection area at the second distance is not greater than the electromagnetic interference measured from the same detection area at the first distance.

6. The method according to claim 4, wherein the electromagnetic interference is at least one of a frequency and an intensity of an electromagnetic wave in an electromagnetic near field.

7. The method according to claim 4, wherein the first distance is not more than 50 mm and the second distance is not less than 5 mm.

* * * * *